(12) United States Patent
Kim et al.

(10) Patent No.: US 12,666,849 B2
(45) Date of Patent: Jun. 23, 2026

(54) DISPLAY PANEL, ELECTRONIC APPARATUS INCLUDING THE DISPLAY PANEL, AND METHOD OF MANUFACTURING THE DISPLAY PANEL

(71) Applicant: Samsung Display Co., Ltd., Yongin-si (KR)

(72) Inventors: Namjin Kim, Yongin-si (KR); Mikyung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 349 days.

(21) Appl. No.: 18/476,002

(22) Filed: Sep. 27, 2023

(65) Prior Publication Data

US 2024/0276845 A1 Aug. 15, 2024

(30) Foreign Application Priority Data

Feb. 15, 2023 (KR) ........................ 10-2023-0020117

(51) Int. Cl.
 *H10K 59/80* (2023.01)
 *H10K 59/12* (2023.01)
 *H10K 59/124* (2023.01)
 *H10K 59/131* (2023.01)

(52) U.S. Cl.
 CPC ..... *H10K 59/8731* (2023.02); *H10K 59/1201* (2023.02); *H10K 59/124* (2023.02); *H10K 59/131* (2023.02)

(58) Field of Classification Search
 CPC ........... H01K 59/8731; H01K 59/1201; H01K 59/124; H01K 59/131
 See application file for complete search history.

(56) References Cited

U.S. PATENT DOCUMENTS

| | | | |
|---|---|---|---|
| 10,826,002 B2 | 11/2020 | Park et al. | |
| 11,233,217 B2 | 1/2022 | Wang et al. | |
| 11,581,376 B2 | 2/2023 | Bang et al. | |
| 12,408,542 B2 * | 9/2025 | Jo | H10K 59/65 |
| 2022/0263046 A1 * | 8/2022 | Lee | H10K 59/88 |

FOREIGN PATENT DOCUMENTS

| | | | | |
|---|---|---|---|---|
| CN | 111584545 B | * | 7/2025 | ........... H10K 59/131 |
| KR | 10-2105509 B1 | | 4/2020 | |
| KR | 10-2021-0055422 A | | 5/2021 | |
| KR | 10-2021-0109715 A | | 9/2021 | |
| KR | 10-2022-0074845 A | | 6/2022 | |

* cited by examiner

*Primary Examiner* — Joseph L Williams
(74) *Attorney, Agent, or Firm* — Womble Bond Dickinson (US) LLP

(57) ABSTRACT

A display panel includes: a substrate including an opening area, a display area surrounding at least a portion of the opening area, an intermediate area between the opening area and the display area, and a peripheral area outside the display area; a first dam in the peripheral area and surrounding the display area; a second dam in the peripheral area and outside the first dam; a power supply line in the peripheral area and defining a notch overlapping the first dam and the second dam; and a first inorganic encapsulation layer in the display area, the intermediate area, and the peripheral area to cover the first dam and the second dam, wherein a portion of a boundary of the notch between the first dam and the second dam is in direct contact with the first inorganic encapsulation layer.

20 Claims, 17 Drawing Sheets

DISPLAY PANEL, ELECTRONIC APPARATUS INCLUDING THE DISPLAY PANEL, AND METHOD OF MANUFACTURING THE DISPLAY PANEL

CROSS-REFERENCE TO RELATED APPLICATION

The present application claims priority to and the benefit of Korean Patent Application No. 10-2023-0020117, filed on Feb. 15, 2023, in the Korean Intellectual Property Office, the entire disclosure of which is incorporated herein by reference.

BACKGROUND

1. Field

Aspects of one or more embodiments relate to a display panel, an electronic apparatus including the display panel, and a method of manufacturing the display panel.

2. Description of the Related Art

Recently, the various uses of display panels has become more diversified. In addition, as display panels have become relatively thinner and lighter, their range of uses has been gradually expanded.

A display panel generally includes a display area and a peripheral area outside the display area, wherein the display area is configured to display images. Light-emitting diodes and thin-film transistors are arranged in the display area. The thin-film transistors are configured to control a corresponding light-emitting diode to emit light of a preset or predetermined color by using a data signal, a driving voltage, and a common voltage transferred thereto.

A data driving circuit, a driving voltage supply line, a common voltage supply line, and the like may be arranged in the peripheral area to provide data signals, driving voltages, common voltages, and the like.

As the area occupied by the display area in display panels expands, various functions that are combined or associated with the display panels have been added. As alternatives for adding various functions while enlarging an area, research into display apparatuses in which various elements may be arranged in the display area has been carried out.

The above information disclosed in this Background section is only for enhancement of understanding of the background and therefore the information discussed in this Background section does not necessarily constitute prior art.

SUMMARY

As a ratio occupied by a display area capable of providing images in a display panel increases, a peripheral area, which is a dead space in which light-emitting diodes are not arranged, may be reduced. Accordingly, a space for elements arranged in the peripheral area may be reduced.

Aspects of one or more embodiments include a display panel including an extended display area, an electronic apparatus including the display panel, and a method of manufacturing the display panel. However, such a technical problem is an example, and embodiments according to the present disclosure are not limited thereto.

Additional aspects will be set forth in part in the description which follows and, in part, will be apparent from the description, or may be learned by practice of the presented embodiments of the disclosure.

According to one or more embodiments, a display panel includes a substrate including an opening area, a display area surrounding at least a portion of the opening area, an intermediate area between the display area and the opening area, and a peripheral area outside the display area, a first dam arranged in the peripheral area and surrounding the display area, a second dam arranged in the peripheral area and arranged outside the first dam, a power supply line (which may refer to a common power supply line in the following) arranged in the peripheral area and defining a notch overlapping the first dam and the second dam, and a first inorganic encapsulation layer arranged in the display area, the intermediate area, and the peripheral area to cover the first dam and the second dam, wherein a portion of a boundary of the notch arranged between the first dam and the second dam is in direct contact with the first inorganic encapsulation layer.

According to some embodiments, the display panel may further include a metal pattern arranged in the peripheral area and overlapping the notch, wherein the metal pattern is apart from (e.g. spaced apart from) the power supply line.

According to some embodiments, the notch may include a first boundary, a second boundary, and a third boundary, wherein the first boundary extends from the first dam to the second dam, the second boundary faces the first boundary, and the third boundary connects the first boundary and the second boundary to each other, and wherein the third boundary overlaps the first dam.

According to some embodiments, the display panel may further include an organic encapsulation layer on the first inorganic encapsulation layer, and a second inorganic encapsulation layer on the organic encapsulation layer, wherein an end of the organic encapsulation layer may be on the first dam.

According to some embodiments, the display panel may further include a first organic insulating layer arranged in the intermediate area and defining a first groove surrounding the opening area, a metal layer on the first organic insulating layer and including a tip extending in a direction from an upper surface of the first organic insulating layer to a center of the first groove, and a second organic insulating layer on the metal layer.

According to some embodiments, the display panel may further include a light-emitting diode arranged in the display area and including a pixel electrode, an opposite electrode, and an intermediate layer between the pixel electrode and the opposite electrode, wherein the intermediate layer may include a first portion and a second portion apart (e.g. spaced apart) and separated from each other by the tip.

According to one or more embodiments, an electronic apparatus includes a display panel including a substrate including an opening area, a display area surrounding at least a portion of the opening area, an intermediate area between the display area and the opening area, and a peripheral area outside the display area, and a component arranged to overlap the opening area of the display panel, wherein the display panel further includes a first dam arranged in the peripheral area and surrounding the display area, a second dam arranged in the peripheral area and arranged outside the first dam, a power supply line arranged in the peripheral area and defining a notch overlapping the first dam and the second dam, and a first inorganic encapsulation layer arranged in the display area, the intermediate area, and the peripheral area to cover the first dam and the second dam, wherein a portion of a boundary of the notch arranged between the first dam and the second dam is in direct contact with the first inorganic encapsulation layer.

According to some embodiments, the electronic apparatus may further include a metal pattern arranged in the peripheral area and overlapping the notch, wherein the metal pattern is apart from (e.g. spaced apart from) the power supply line.

According to some embodiments, the notch may include a first boundary, a second boundary, and a third boundary, wherein the first boundary extends from the first dam to the second dam, the second boundary faces the first boundary, and the third boundary connects the first boundary and the second boundary to each other, and wherein the third boundary overlaps the first dam.

According to some embodiments, the electronic apparatus may further include an organic encapsulation layer on the first inorganic encapsulation layer, and a second inorganic encapsulation layer on the organic encapsulation layer, wherein an end of the organic encapsulation layer may be on the first dam.

According to some embodiments, the electronic apparatus may further include a first organic insulating layer arranged in the intermediate area and defining a first groove surrounding the opening area, a metal layer on the first organic insulating layer and including a tip extending in a direction from an upper surface of the first organic insulating layer to a center of the first groove, and a second organic insulating layer on the metal layer.

According to some embodiments, the electronic apparatus may further include a light-emitting diode arranged in the display area and including a pixel electrode, an opposite electrode, and an intermediate layer between the pixel electrode and the opposite electrode, wherein the intermediate layer may include a first portion and a second portion apart (e.g. spaced apart) and separated from each other by the tip.

According to one or more embodiments, a method of manufacturing a display panel includes preparing a substrate including an opening area, a display area surrounding at least a portion of the opening area, an intermediate area between the display area and the opening area, and a peripheral area outside the display area, forming a first dam, a second dam, a power supply line, and an organic bridge in the peripheral area, wherein the first dam surrounds the display area, the second dam is outside the first dam, the power supply line defines a notch overlapping the first dam and the second dam, and the organic bridge covers a portion of a boundary of the notch located between the first dam and the second dam, forming a sacrificial layer to cover the first dam, the second dam, and the organic bridge, removing a portion of the sacrificial layer overlapping the organic bridge, removing the organic bridge, and removing the sacrificial layer.

According to some embodiments, the organic bridge may connect the first dam and the second dam to each other.

According to some embodiments, the method may further include forming a first inorganic encapsulation layer in the display area, the intermediate area, and the peripheral area to cover the first dam and the second dam, wherein the portion of the boundary of the notch located between the first dam and the second dam may be in direct contact with the first inorganic encapsulation layer.

According to some embodiments, the method may further include before the forming of the sacrificial layer, forming a first organic insulating layer in the intermediate area, forming a metal layer on the first organic insulating layer, wherein the metal layer defines a first hole surrounding the opening area, and forming a second organic insulating layer on the metal layer, wherein the second organic insulating layer defines a first sub-hole overlapping the first hole.

According to some embodiments, in the forming of the sacrificial layer, the sacrificial layer may be formed on the second organic insulating layer and the first organic insulating layer exposed through the first sub-hole.

According to some embodiments, in the removing of the portion of the sacrificial layer overlapping the organic bridge, a portion of the sacrificial layer overlapping the first hole may be simultaneously removed.

According to some embodiments, in the removing of the organic bridge, a portion of the first organic insulating layer overlapping the first hole may be simultaneously removed, and a first groove surrounding the opening area may be formed.

According to some embodiments, the metal layer may form a tip extending in a direction from an upper surface of the first organic insulating layer to a center of the first groove.

These and/or other aspects will become more apparent and more readily appreciated from the following detailed description of the embodiments, the accompanying drawings, and claims.

BRIEF DESCRIPTION OF THE DRAWINGS

The above and other aspects, features, and characteristics of certain embodiments of the disclosure will be more apparent from the following description taken in conjunction with the accompanying drawings, in which:

FIG. 10 is a schematic cross-sectional view of the display panel of FIG. 9, taken along the line VI-VI' of FIG. 9;

FIG. 11 is a schematic cross-sectional view of the display panel of FIG. 9, taken along the line VII-VII' of FIG. 9;

FIGS. 13 to 17 are schematic cross-sectional views showing some of operations of a method of manufacturing a display panel according to some embodiments.

DETAILED DESCRIPTION

Figure 1:
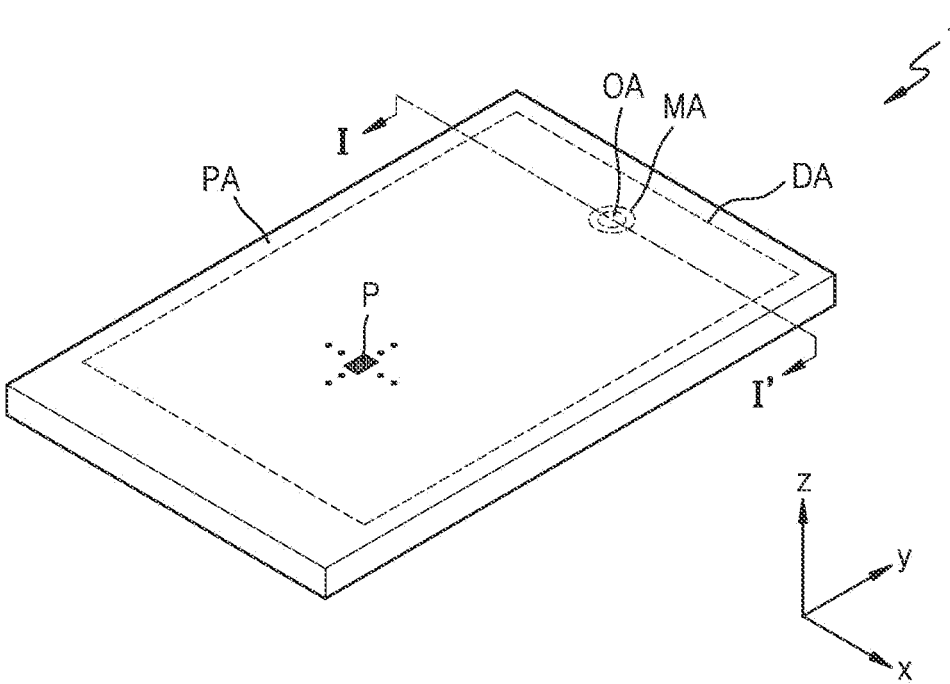
FIG. 1 is a schematic perspective view of an electronic apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, aspects of some embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or element is referred to as being "electrically connected" to another layer, region, or element, it may be "directly electrically connected" to the other layer, region, or element or may be "indirectly electrically connected" to the other layer, region, or element with another layer, region, or element interposed therebetween.

In the present specification, "A and/or B" means A or B, or A and B. In the present specification, "at least one of A and B" means A or B, or A and B.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different orientations that are not perpendicular to one another.

In the case where a certain embodiment may be implemented differently, a specific process order may be performed in the order different from the described order. As an example, two processes successively described may be simultaneously performed substantially and performed in the opposite order.

Sizes of elements in the drawings may be exaggerated or reduced for convenience of explanation. As an example, the size and thickness of each element shown in the drawings are arbitrarily represented for convenience of description, and thus, embodiments according to the present disclosure are not necessarily limited thereto.

FIG. 1 is a schematic perspective view of an electronic apparatus 1 according to some embodiments.

The electronic apparatus 1 may be used as a display screen for various products including televisions, notebook computers, monitors, advertisement boards, Internet of things (IoTs)-based devices as well as portable electronic apparatuses including mobile phones, smartphones, tablet personal computers (PCs), mobile communication terminals, electronic organizers, electronic books, portable multimedia players (PMPs), navigations, and ultra mobile personal computers (UMPCs). In addition, the electronic apparatus 1 may be used in wearable devices including smartwatches, watchphones, glasses-type displays, and head-mounted displays (HMDs). In addition, according to some embodiments, the electronic apparatus 1 may be used as a display in instrument panels for automobiles, center fascias for automobiles, or center information displays (CIDs) arranged on a dashboard, room mirror displays that replace side mirrors of automobiles, and displays of an entertainment system arranged on the backside of front seats for backseat passengers in automobiles. The electronic apparatus 1 is bendable, foldable, or rollable. For convenience of description, FIG. 1 shows the case where the electronic apparatus 1 according to some embodiments is used as a smartphone.

The electronic apparatus 1 may have a rectangular shape in a plan view. As an example, as shown in FIG. 1, the electronic apparatus 1 may have a quadrangular shape having short sides in an x axis direction and long sides in a y axis direction in a plan view (e.g., a view that is perpendicular or normal with respect to a plane of the display surface of the electronic apparatus 1 or a plane defined by the x axis and the y axis directions). A corner where the short side in the x axis direction meets the long side in the y axis direction may be round to have a preset curvature or formed to have a right angle. A planar shape of the electronic apparatus 1 is not limited to a rectangle, but may be other polygons, ellipses, irregular shapes, or any other suitable shape according to the design of the electronic apparatus 1.

The electronic apparatus 1 may include an opening area OA (or a first region) and a display area DA (or a second region) at least partially surrounding the opening area OA. The electronic apparatus 1 may include an intermediate area MA and a peripheral area PA, wherein the intermediate area MA is arranged between the opening area OA and the display area DA, and the peripheral area PA surrounds the outer side of the display area DA. That is, the peripheral area PA may be located in a periphery outside a footprint of the display area DA. Each of the intermediate area MA and the peripheral area PA may be a region in which pixels are not arranged and images are not displayed. As an example, each of the intermediate area MA and the peripheral area PA may be a dead space.

The opening area OA may be located inside the display area DA. According to some embodiments, the opening area OA may be arranged on the upper center of the display area DA as shown in FIG. 1. Alternatively, the opening area OA may be arranged on the upper left side of the display area DA, or the upper right side of the display area DA. However, the opening area OA may be arranged at various positions, or a plurality of positions according to the design of the electronic apparatus 1. In a plan view of the present specification, "left", "right", "up", and "down" denote directions when the electronic apparatus 1 is viewed in a direction perpendicular to the electronic apparatus 1. As an example, "left" denotes a −x direction, "right" denotes a +x direction, "up" denotes a +y direction, and "down" denotes a −y direction. Although it is shown in FIG. 1 that one opening area OA is arranged, a plurality of opening areas OA may be arranged according to some embodiments.

The display area DA is a portion or area configured to display images, and a plurality of pixels P may be arranged in the display area DA. Although a single pixel P is illustrated in FIG. 1, as a person having ordinary skill in the art would recognize, the display area DA may include any suitable number of pixels P according to the size and design of the electronic apparatus 1. Each of the pixels P may denote a sub-pixel and include a display element such as a light-emitting diode. The pixel P may be configured to emit, for example, red, green, blue, or white light.

Figure 2:
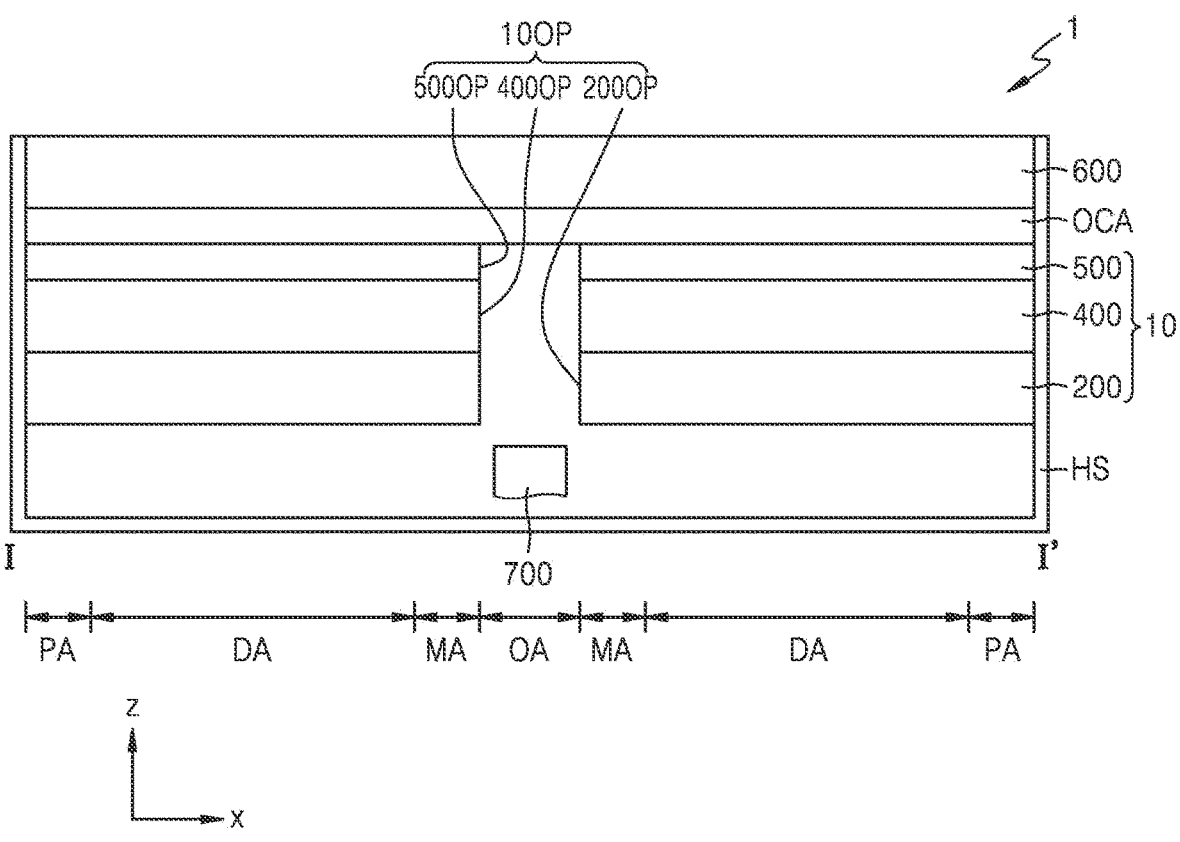
FIG. 2 is a schematic cross-sectional view of the electronic apparatus of FIG. 1, taken along the line I-I' of FIG. 1.

FIG. 2 is a schematic cross-sectional view of the electronic apparatus 1 of FIG. 1, taken along the line I-I' of FIG. 1.

Referring to FIG. 2, the electronic apparatus 1 may include a display panel 10 and a component 700 arranged in the opening area OA of the display panel 10. The display panel 10 and the component 700 may be received in a housing HS.

The display panel 10 may include a display layer 200, an input sensing layer 400, and an optical functional layer 500. The electronic apparatus 1 may further include a cover window 600.

The display layer 200 may include the display element (or a light-emitting diode) configured to emit light to display images, and pixel circuits connected to each display element to apply electrical signals to the display element. The display element may include, the light-emitting diode, for example, an organic light-emitting diode including an organic emission layer.

The input sensing layer 400 may be configured to obtain coordinate information corresponding to an external input, for example, a touch event. The input sensing layer 400 may include a sensing electrode (or a touch electrode) and trace lines connected to the sensing electrode. The input sensing layer 400 may be located on the display layer 200. The input sensing layer 400 may be configured to sense an external input by using a self-capacitance method and/or a mutual capacitance method.

The input sensing layer 400 may be directly formed on the display layer 200, or separately formed and then coupled to the display layer 200 by using an optically clear adhesive. As an example, a process of forming the input sensing layer 400 may be successively formed after a process of forming the display layer 200. In this case, an adhesive layer may not be located between the input sensing layer 400 and the display layer 200. Although it is shown in FIG. 2 that the input sensing layer 400 is located between the display layer 200 and the optical functional layer 500, the input sensing layer 400 may be located on the optical functional layer 500.

The optical functional layer 500 may include an anti-reflection layer. The anti-reflection layer may reduce the reflectivity of light (external light) incident toward the display panel 10 from the outside through the cover window 600. The anti-reflection layer may include a phase retarder and a polarizer. The phase retarder may include a film-type phase retarder or a liquid crystal-type phase retarder. The polarizer may include a film-type polarizer or a liquid crystal-type polarizer. The film-type polarizer may include a stretchable synthetic resin film, and the liquid crystal-type polarizer may include liquid crystals arranged in a set or predetermined arrangement.

According to some embodiments, the anti-reflection layer may include a black matrix and color filters. The color filters may be arranged by taking into account colors of light emitted respectively from the light-emitting diodes of the display layer 200. According to some embodiments, the anti-reflection layer may include a destructive interference structure. The destructive interference structure may include a first reflection layer and a second reflection layer respectively located on different layers. First-reflected light and second-reflected light respectively reflected by the first reflection layer and the second reflection layer may destructively interfere and thus the reflectivity of external light may be reduced.

The optical functional layer 500 may include a lens layer. The lens layer may improve a light output efficiency of light emitted from the display layer 200 or reduce color deviation. The lens layer may include a layer having a lens shape that is concave or convex, and/or a plurality of layers having different refractive indexes. The optical functional layer 500 may include both the anti-reflection layer and the lens layer described above, or one of the anti-reflection layer and the lens layer.

The display panel 10 may include a through hole 10OP. With regard to this, it is shown in FIG. 2 that the display layer 200, the input sensing layer 400, and the optical functional layer 500 respectively include first to third through holes 200OP, 400OP, and 500OP, and the first to third through holes 200OP, 400OP, and 500OP overlap each other to form the through hole 10OP.

The first through hole 200OP may pass through from the upper surface to the bottom surface of the display layer 200, the second through hole 400OP may pass through from the upper surface to the bottom surface of the input sensing layer 400, and the third through hole 500OP may pass through from the upper surface to the bottom surface of the optical functional layer 500.

The through holes of the display panel 10, for example, the first to third through holes 200OP, 400OP, and 500OP may be positioned to overlap each other in the opening area OA. The first to third through holes 200OP, 400OP, and 500OP may be equal to or different from one another in size (or diameter).

According to some embodiments, at least one of the display layer 200, the input sensing layer 400, or the optical functional layer 500 may not include a through hole. As an example, one or two of the display layer 200, the input sensing layer 400, and the optical functional layer 500 may not include a through hole.

The cover window 600 may be located on the optical functional layer 500. The cover window 600 may be coupled to the optical functional layer 500 by an adhesive layer such as an optical clear adhesive (OCA) located between the cover window 600 and the optical functional layer 500. The cover window 600 may include glass or plastic. As an example, the cover window 600 may include an ultra-thin glass window. As an example, the cover window 600 may include polyethersulfone, polyacrylate, polyetherimide, polyethylene naphthalate, polyethylene terephthalate, polyphenylene sulfide, polyarylate, polyimide, polycarbonate, cellulose acetate propionate, or the like.

The opening area OA may be a kind of component area (e.g., a sensor region, a camera region, a speaker region, and the like) in which the component 700 for adding various functions to the electronic apparatus 1 is located. The component 700 may be located below the display panel 10 to overlap the through hole 10OP of the display panel 10.

The component 700 may include an electronic element. As an example, the component 700 may be an electronic element that uses light or sound. As an example, the electronic element may include a sensor such as an infrared sensor that uses light, a camera that receives light to capture an image, a sensor that outputs and senses light or sound to measure a distance or recognize a fingerprint, a small lamp that outputs light, and a speaker that outputs sound. The electronic element that uses light may use light in various wavelength bands such as visible light, infrared light, ultraviolet light and the like. The opening area OA corresponds to a transmission area through which light and/or sound output from the component 700 to the outside or progressing toward the electronic element from the outside may pass.

According to some embodiments, in the case where the electronic apparatus 1 is used as a smartwatch or an instrument panel for an automobile, the component 700 may be a member such as clock hands or a needle indicating information (e.g., the velocity of a vehicle, and the like). In this case, unlike FIG. 2, the cover window 600 may define a through hole located in the opening area OA such that the component 700 such as a needle is exposed to the outside. Alternatively, even in the case where the electronic apparatus 1 includes the component 700 such as a speaker, the cover window 600 may define a through hole corresponding to the opening area OA.

Figure 3:
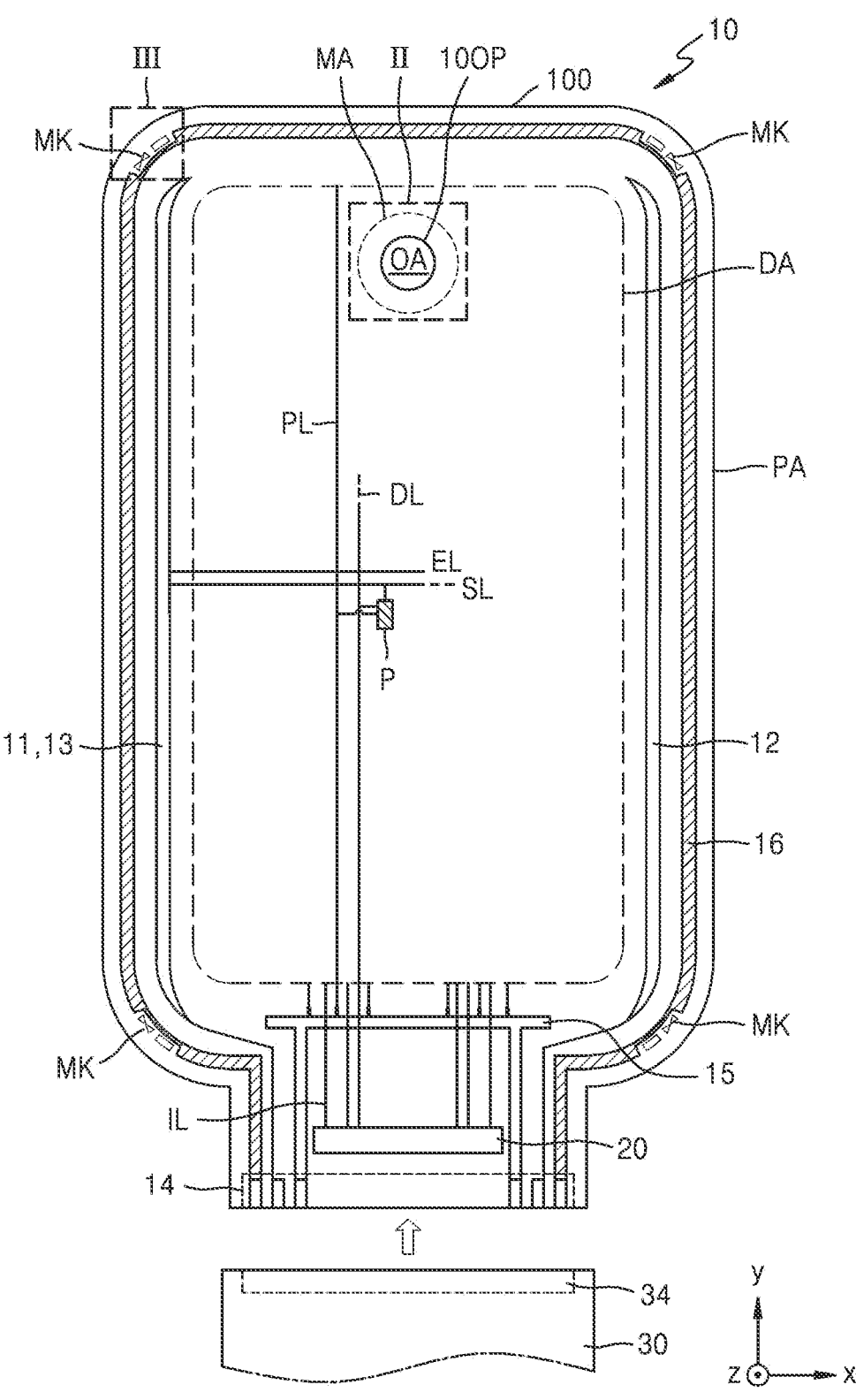
FIG. 3 is a schematic plan view of a display panel according to some embodiments.

FIG. 3 is a schematic plan view of the display panel 10 according to some embodiments.

Referring to FIG. 3, the display panel 10 includes the opening area OA, the display area DA, the intermediate area MA, and the peripheral area PA, wherein the display area DA surrounds at least a portion of the opening area OA, the intermediate area MA is between the opening area OA and the display area DA, and the peripheral area PA is outside the display area DA.

The display panel 10 includes the substrate 100. In the present specification, when the display panel 10 includes the opening area OA, the display area DA, the intermediate area MA, and the peripheral area PA, it may refer to the substrate 100 including the opening area OA, the display area DA, the intermediate area MA, and the peripheral area PA.

The opening area OA may be located inside the display area DA. With regard to this, it is shown in FIG. 3 that the opening area OA is arranged in the upper center of the display area DA. The opening area OA may be arranged in various positions such as the upper left side or the upper right side, and be provided in plurality.

The display panel 10 may define the through hole 10OP corresponding to the opening area OA. In the present specification, the opening area OA may denote the through hole 10OP of the display panel 10.

The display area DA is a portion configured to display images, and the plurality of pixels P may be arranged in the display area DA. Although it is shown in FIG. 3 that the display area DA has a rectangular shape having round edges, the embodiments according to the present disclosure are not limited thereto. As described above, the display area DA may have various shapes such as an N-gon (where N is a natural number of 3 or more), a circle, or an ellipse.

The peripheral area PA may be arranged outside the display area DA. Outer circuits may be arranged in the peripheral area PA, wherein the outer circuits are configured to drive the pixels P. As an example, a first scan driving circuit 11, a second scan driving circuit 12, an emission control driving circuit 13, a terminal 14, a driving power supply line 15, and a common power supply line 16 may be arranged in the peripheral area PA.

The first scan driving circuit 11 may be configured to provide scan signals to the pixel P through a scan line SL (which may be referred to as a scan line GW hereinafter). The second scan driving circuit 12 may be arranged in parallel to the first scan driving circuit 11 with the display area DA therebetween. Some of the pixels P arranged in the display area DA may be electrically connected to the first scan driving circuit 11, and the others may be connected to the second scan driving circuit 12. When needed, the second scan driving circuit 12 may be omitted, and all of the pixels P arranged in the display area DA may be electrically connected to the first scan driving circuit 11.

The emission control driving circuit 13 may be arranged on the side of the first scan driving circuit 11 and configured to provide emission control signals to the pixels P through an emission control line EL (which may be referred to as an emission control line EM hereinafter). Although it is shown in FIG. 3 that the emission control driving circuit 13 is arranged on only one side of the display area DA, like the first scan driving circuit 11 and the second scan driving circuit 12, the emission control driving circuit 13 may be arranged on two opposite sides of the display area DA.

A driving chip 20 may be arranged in the peripheral area PA. The driving chip 20 may include an integrated circuit configured to drive the display panel 10. Although the integrated circuit may be a data driving integrated circuit configured to generate data signals, the embodiments according to the present disclosure are not limited thereto.

The terminal 14 may be arranged in the peripheral area PA. The terminal 14 may be exposed by not being covered by an insulating layer, and electrically connected to a printed circuit board 30. A terminal 34 of the printed circuit board 30 may be electrically connected to the terminal 14 of the display panel 10.

The printed circuit board 30 is configured to transfer signals of a controller or power to the display panel 10. Control signals generated by the controller may be respectively transferred to the driving circuits through the printed circuit board 30. In addition, the controller may be configured to transfer a driving voltage ELVDD (e.g. refer to FIG. 4) to the driving power supply line 15 and transfer a common voltage ELVSS (e.g. refer to FIG. 4) to the common power supply line 16. The driving voltage ELVDD may be transferred to each pixel P through a driving voltage line PL connected to the driving power supply line 15. The driving power supply line 15 may have a shape extending in one direction (e.g., the x direction) below the display area DA. The common power supply line 16 may have a loop shape having one open side and have a shape partially surrounding the display area DA.

The controller is configured to generate data signals, and the generated data signals are transferred to an input line IL through the driving chip 20 and transferred to the pixel P through a data line DL connected to the input line IL. For reference, a "line" may mean a "wiring". This is applicable to embodiments below and modifications thereof.

A metal pattern MK may be arranged in the peripheral area PA. As an example, as shown in FIG. 3, the metal pattern MK may be located on the edge of the display panel 10. The metal pattern MK may be an island pattern separated and electrically insulated from other elements.

The metal pattern MK may be used as an identification mark for locating the display panel 10 and aligning the display panel 10 in a process of attaching the display panel 10 and the cover window 600 (or a functional module and the like) to each other.

The metal pattern MK may be arranged to be spaced apart from the common power supply line 16. In other words, in a plan view, the metal pattern MK may not overlap the common power supply line 16. As an example, the metal pattern MK may be located in an opening defined by removing a portion of the common power supply line 16. Accordingly, when light is irradiated from the rear surface of the display panel 10, the shade of the metal pattern MK may be prevented from not being identified by the shadow of the common power supply line 16.

Figure 4:
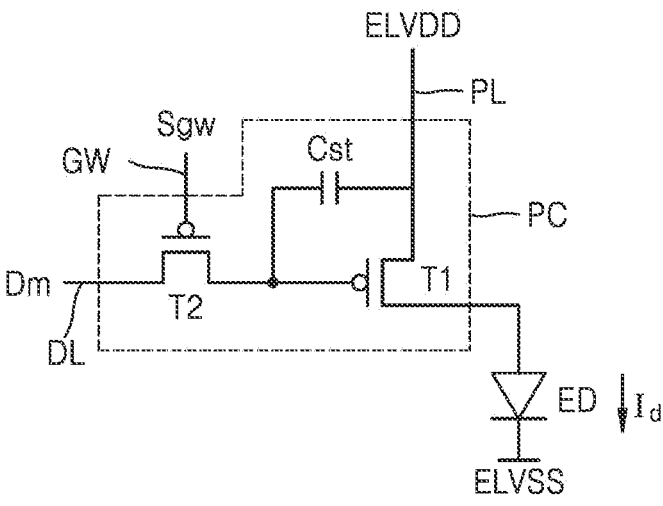
FIGS. 4 and 5 are schematic equivalent circuit diagrams of a pixel of a display panel according to some embodiments.
Figure 5:
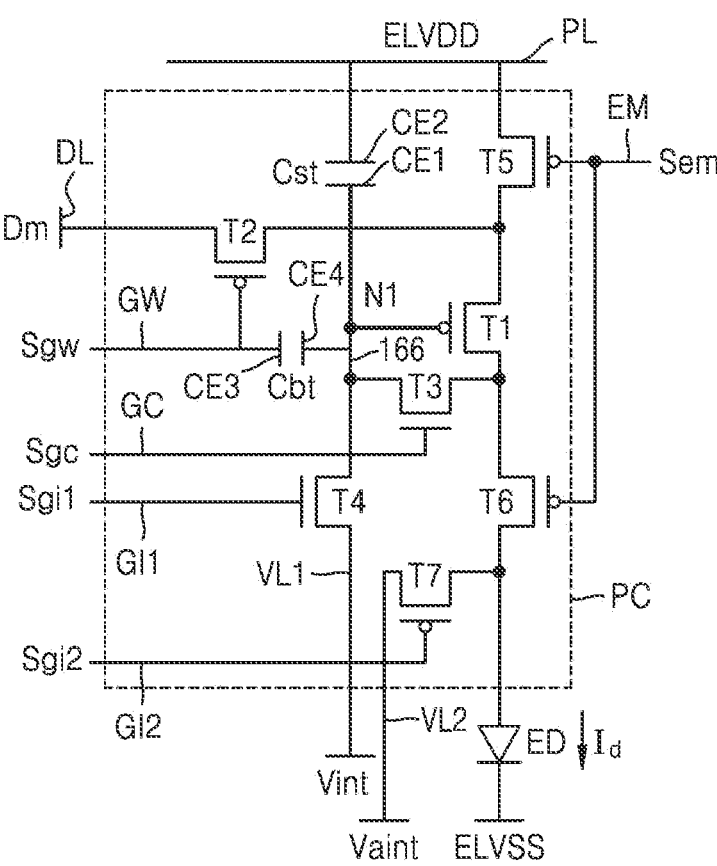

FIGS. 4 and 5 are schematic equivalent circuit diagrams of a pixel of the display panel 10 according to some embodiments.

Referring to FIG. 4, a pixel of the display panel 10 may include a light-emitting diode ED as a display element. The light-emitting diode ED may be electrically connected to a pixel circuit PC, and the pixel circuit PC may include a first transistor T1, a second transistor T2, and a storage capacitor Cst.

The second transistor T2 is configured to transfer a data signal Dm to the first transistor T1 according to a scan signal Sgw input through the scan line GW, wherein the data signal Dm is input through the data line DL.

The storage capacitor Cst may be connected to the second transistor T2 and a driving voltage line PL and configured to store a voltage corresponding to a difference between a voltage transferred from the second transistor T2 and a driving voltage ELVDD supplied to the driving voltage line PL.

The first transistor T1 may be connected to the driving voltage line PL and the storage capacitor Cst and configured to control a driving current $I_d$ according to the voltage stored in the storage capacitor Cst, the driving current $I_d$ flowing from the driving voltage line PL to the light-emitting diode ED. An opposite electrode (e.g., a cathode) of the light-emitting diode ED may be configured to receive the common voltage ELVSS. The light-emitting diode ED may be configured to emit light having a preset brightness corresponding to the driving current $I_d$.

Although it is described with reference to FIG. 4 that the pixel circuit PC includes two transistors and one storage capacitor, the embodiments according to the present disclosure are not limited thereto.

Referring to FIG. 5, the pixel circuit PC may include seven transistors and two capacitors.

The pixel circuit PC may include first to seventh transistors T1, T2, T3, T4, T5, T6, and T7, a storage capacitor Cst, and a boost capacitor Cbt. According to some embodiments, the pixel circuit PC may not include the boost capacitor Cbt. Additionally, according to some embodiments, the pixel circuit PC may include additional components or fewer components without departing from the spirit and scope of embodiments according to the present disclosure.

Some of the first to seventh transistors T1, T2, T3, T4, T5, T6, and T7 may be n-channel metal oxide semiconductor (NMOS) field-effect transistors (n-channel MOSFETs), and the rest may be p-channel metal oxide semiconductor (PMOS) field-effect transistors (p-channel MOSFETs). In another example, the third and fourth transistors T3 and T4 may be n-channel MOSFETs, and the rest may be p-channel MOSFETs.

The first to seventh transistors T1, T2, T3, T4, T5, T6, and T7, the storage capacitor Cst, and the boost capacitor Cbt may be connected to signal lines. The signal lines may include an emission control line EM, a compensation gate line GC, a first initialization gate line GI1, a second initialization gate line GI2, and the data line DL. The pixel circuit PC may be electrically connected to a voltage line, for example, the driving voltage line PL, a first initialization voltage line VL1, and a second initialization voltage line VL2.

The first transistor T1 may be a driving transistor. A first gate electrode of the first transistor T1 may be connected to the storage capacitor Cst, a first electrode of the first transistor T1 may be electrically connected to the driving voltage line PL through the fifth transistor T5, and a second electrode of the first transistor T1 may be electrically connected to a pixel electrode (e.g., an anode) of the light-emitting diode ED through the sixth transistor T6. One of the first electrode and the second electrode of the first transistor T1 may be a source electrode, and the other may be a drain electrode. The first transistor T1 may be configured to supply the driving current $I_d$ to the light-emitting diode ED according to a switching operation of the second transistor T2.

The second transistor T2 may be a switching transistor. A second gate electrode of the second transistor T2 is connected to the scan line GW, a first electrode of the second transistor T2 is connected to the data line DL, and a second electrode of the second transistor T2 is connected to the first electrode of the first transistor T1 and electrically connected to the driving voltage line PL through the fifth transistor T5. One of the first electrode and the second electrode of the second transistor T2 may be a source electrode, and the other may be a drain electrode. The second transistor T2 may be turned on according to a scan signal Sgw transferred through the scan line GW and may perform a switching operation of transferring a data signal Dm to the first electrode of the first transistor T1, wherein the data signal Dm is transferred through the data line DL.

The third transistor T3 may be a compensation transistor configured to compensate for a threshold voltage of the first transistor T1. A third gate electrode of the third transistor T3 is connected to a compensation gate line GC. A first electrode of the third transistor T3 is connected to a lower electrode CE1 of the storage capacitor Cst through a node connection line 166, and connected to the first gate electrode of the first transistor T1. A first electrode of the third transistor T3 may be connected to the fourth transistor T4. A second electrode of the third transistor T3 is connected to the second electrode of the first transistor T1 and electrically connected to the pixel electrode (e.g., the anode) of the light-emitting diode ED through the sixth transistor T6. One of the first electrode and the second electrode of the third transistor T3 may be a source electrode, and the other may be a drain electrode.

The third transistor T3 is turned on according to a compensation signal Sgc transferred through the compensation gate line GC, and diode-connects the first transistor T1 by electrically connecting the first gate electrode to the second electrode (e.g., a drain electrode) of the first transistor T1.

The fourth transistor T4 may be a first initialization transistor configured to initialize the first gate electrode of the first transistor T1. A fourth gate electrode of the fourth transistor T4 is connected to a first initialization gate line GI1. A first electrode of the fourth transistor T4 is connected to the first initialization voltage line VL1. A second electrode of the fourth transistor T4 may be connected to the lower electrode CE1 of the storage capacitor Cst, the first electrode of the third transistor T3, and the first gate electrode of the first transistor T1. One of the first electrode and the second electrode of the fourth transistor T4 may be a source electrode, and the other may be a drain electrode. The fourth transistor T4 may be turned on according to a first initialization signal Sgi1 transferred through the first initialization gate line GI1 and may perform an initialization operation of initializing the voltage of the first gate electrode of the first transistor T1 by transferring a first initialization voltage Vint to the first gate electrode of the first transistor T1.

The fifth transistor T5 may be an operation control transistor. A fifth gate electrode of the fifth transistor T5 is connected to the emission control line EM, a first electrode of the fifth transistor T5 is connected to the driving voltage line PL, and a second electrode of the fifth transistor T5 is connected to the first electrode of the first transistor T1 and the second electrode of the second transistor T2. One of the first electrode and the second electrode of the fifth transistor T5 may be a source electrode, and the other may be a drain electrode.

The sixth transistor T6 may be an emission control transistor. A sixth gate electrode of the sixth transistor T6 is connected to the emission control line EM, a first electrode of the sixth transistor T6 is connected to the second electrode of the first transistor T1 and the second electrode of the third transistor T3, and a second electrode of the sixth transistor T6 is electrically connected to a second electrode of the seventh transistor T7 and the pixel electrode (e.g., the anode) of the light-emitting diode ED. One of the first electrode and the second electrode of the sixth transistor T6 may be a source electrode, and the other may be a drain electrode.

The fifth transistor T5 and the sixth transistor T6 may be simultaneously turned on according to an emission control signal Sem transferred through the emission control line EM, the driving voltage ELVDD is transferred to the light-emitting diode ED, and the driving current $I_d$ flows through the light-emitting diode ED.

The seventh transistor T7 may be a second initialization transistor configured to initialize the pixel electrode of the light-emitting diode ED. A seventh gate electrode of the seventh transistor T7 is connected to a second initialization gate line GI2. A first electrode of the seventh transistor T7 is connected to the second initialization voltage line VL2. A second electrode of the seventh transistor T7 is connected to the second electrode of the sixth transistor T6 and the pixel electrode (e.g., the anode) of the light-emitting diode ED. The seventh transistor T7 may be turned on according to a second initialization signal Sgi2 transferred through the second initialization gate line GI2, and configured to initialize the pixel electrode of the light-emitting diode ED by transferring a second initialization voltage Vaint to the pixel electrode (e.g., the anode) of the light-emitting diode ED.

According to some embodiments, the second initialization gate line GI2 may be a next scan line. As an example, the second initialization gate line GI2 connected to the seventh transistor T7 of the pixel circuit PC and arranged in an i-th row (i is a natural number greater than 0), may correspond to a scan line of the pixel circuit PC arranged in an (i+1)-th row. According to some embodiments, the second initialization gate line GI2 may be the emission control line EM. As an example, the emission control line EM may be electrically connected to the fifth to seventh transistors T5, T6, and T7.

The storage capacitor Cst includes the lower electrode CE1 and an upper electrode CE2. The lower electrode CE1 of the storage capacitor Cst is connected to the first gate electrode of the first transistor T1, and the upper electrode CE2 of the storage capacitor Cst is connected to the driving voltage line PL. The storage capacitor Cst may be configured to store charge corresponding to a difference between a voltage of the first gate electrode of the first transistor T1 and the driving voltage ELVDD.

The boost capacitor Cbt includes a third electrode CE3 and a fourth electrode CE4. The third electrode CE3 may be connected to the second gate electrode of the second transistor T2 and the scan line GW, and the fourth electrode CE4 may be connected to the first electrode of the third transistor T3 and the node connection line 166. The boost capacitor Cbt may raise the voltage of a first node N1 when a scan signal Sgw supplied to the scan line GW is turned off (i.e. when the scan signal Sgw is in an off-level). When the voltage of the first node N1 is raised, a black grayscale may be clearly expressed.

The first node N1 may be a region where the first gate electrode of the first transistor T1, the first electrode of the third transistor T3, the second electrode of the fourth transistor T4, and the fourth electrode CE4 of the boost capacitor Cbt are connected to each other.

The first transistor T1 directly influencing the brightness of the display panel displaying images may be configured to include a semiconductor layer including polycrystalline silicon having high reliability, and thus, a high-resolution display apparatus may be implemented through this configuration.

Figure 6:
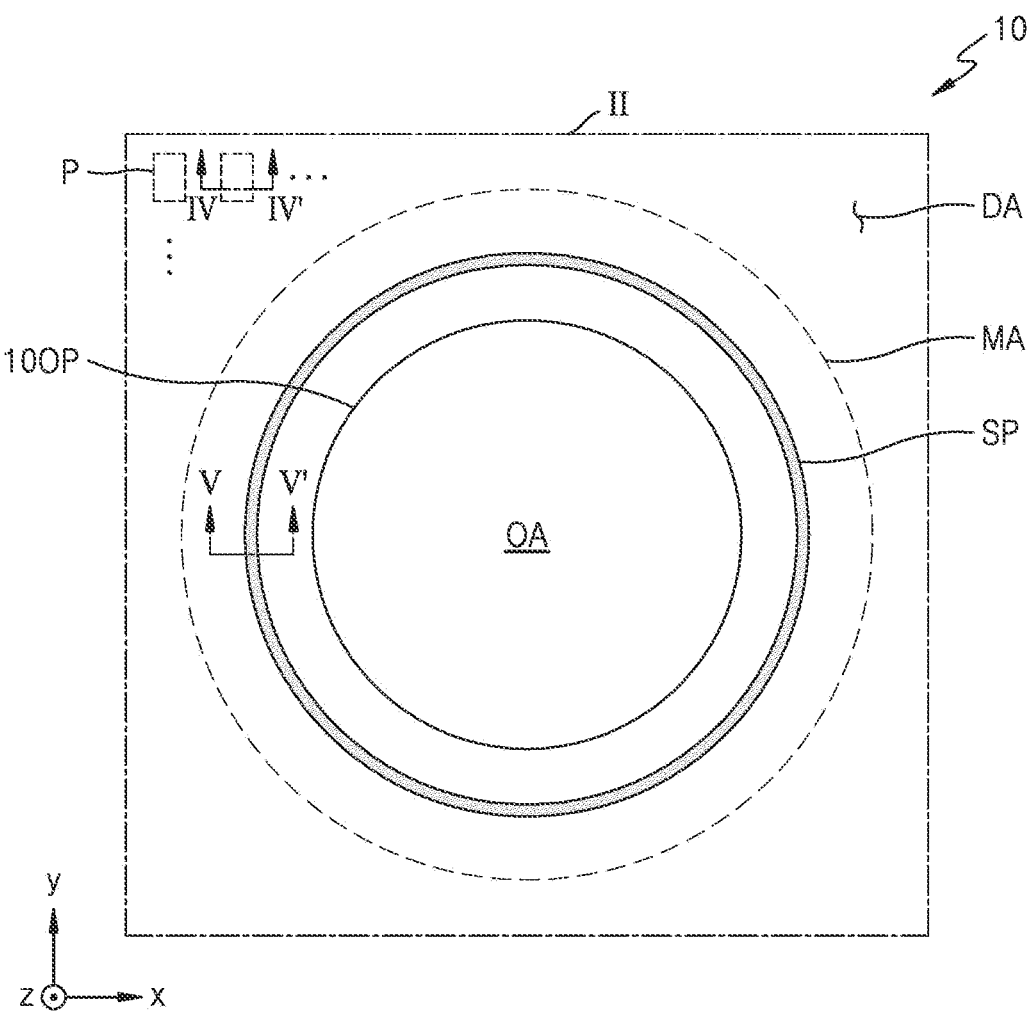
FIG. 6 is a schematic plan view of a region II of the display panel shown in FIG. 3.

FIG. 6 is a schematic plan view of a region II of the display panel 10 shown in FIG. 3.

Referring to FIG. 6, the display panel 10 may include the opening area OA, the display area DA, and the intermediate area MA, wherein the display area DA surrounds at least a portion of the opening area OA, and the intermediate area MA is between the opening area OA and the display area DA.

The opening area OA may be a region corresponding to the through hole 10OP of the display panel 10. The plurality of pixels P may be arranged in the display area DA to display images. Because the display area DA is arranged to surround the opening area OA, the pixels P may be arranged to surround the opening area OA and the intermediate area MA in the display area DA.

In the present specification, the position of the pixel P may correspond to the position of the display element. That is, the position of the pixel P may represent the position of an emission area of an organic light-emitting diode OLED (e.g. refer to FIG. 6). When the pixel P is arranged in the display area DA, it may present that the organic light-emitting diode OLED is arranged in the display area DA.

At least one separator SP may be arranged in the intermediate area MA. To reduce or prevent moisture or contaminants and the like from penetrating the display area DA along the organic material layer from the opening area OA, the separator SP may have a structure for separating the organic material layer.

The separator SP may have a closed loop shape surrounding the opening area OA in a plan view. As an example, in the case where a plurality of separators SP are arranged, the separators SP may be apart from each other to form concentric circles around the opening area OA. As described above, because the opening area OA corresponds to the through hole 10OP of the display panel 10, the separator SP may be arranged between the through hole 10OP and the pixels P.

Figure 7:
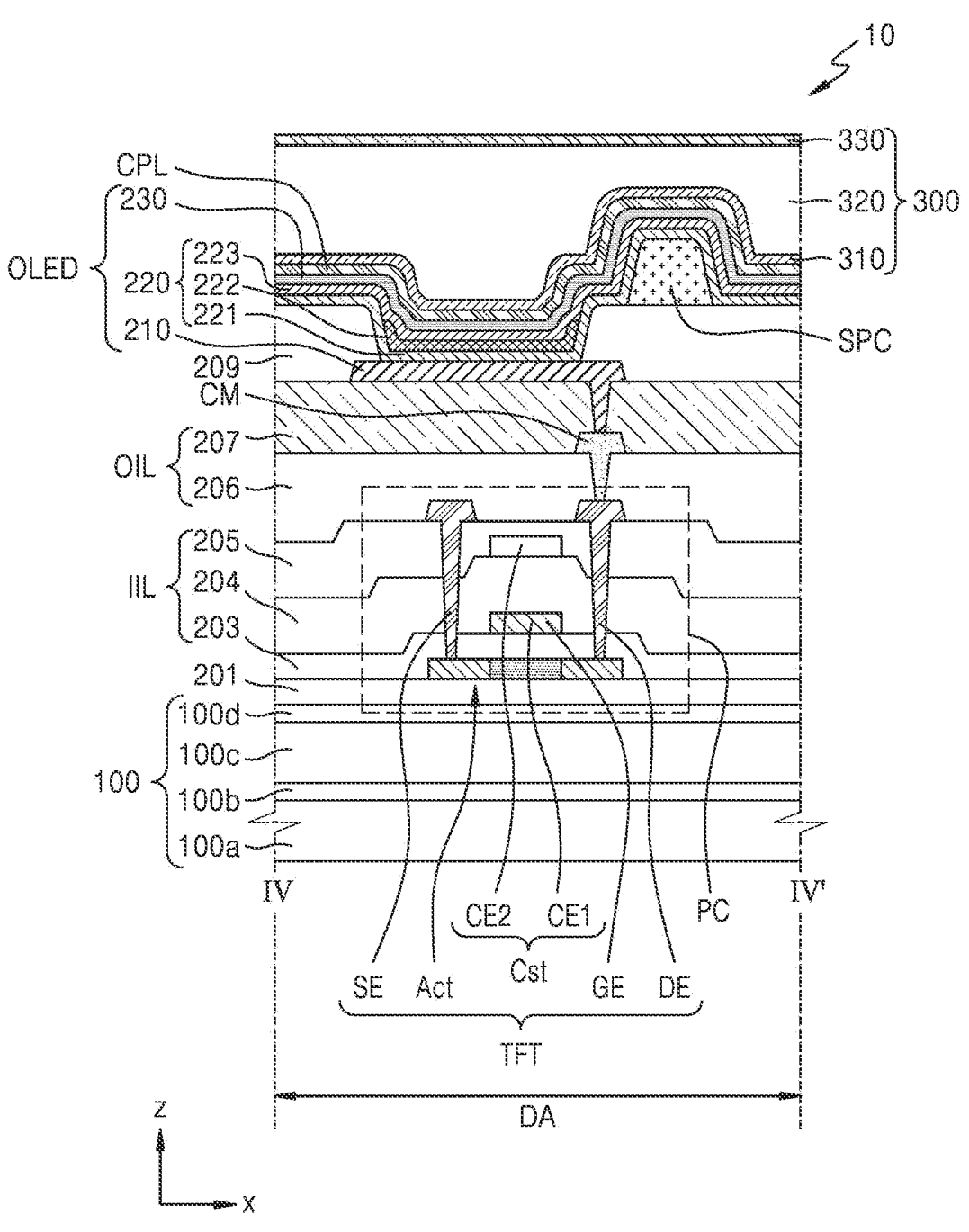
FIG. 7 is a schematic cross-sectional view of the display panel of FIG. 6, taken along the line IV-IV' of FIG. 6.

FIG. 7 is a schematic cross-sectional view of the display panel 10 of FIG. 6, taken along the line IV-IV' of FIG. 6.

Referring to FIG. 7, the display panel 10 may include the substrate 100, the organic light-emitting diode OLED, and the pixel circuit PC electrically connected to the organic light-emitting diode OLED. In other words, the pixel circuit PC and the organic light-emitting diode OLED may be arranged in the display area DA of the substrate 100.

The substrate 100 may include an insulating material such as glass, quartz, a polymer resin or the like. The substrate 100 may be a rigid substrate or a flexible substrate that is bendable, foldable, and rollable. As an example, the first substrate 100 may include a polymer resin such as polyether-sulfone, polyacrylate, polyetherimide, polyethylene naph-thalate, polyethylene terephthalate, polyphenylene sulfide, polyarylate, polyimide, polycarbonate, or cellulose acetate propionate. The substrate 100 may have a multi-layered structure including a layer that includes the polymer resin and an inorganic layer. As an example, the substrate 100 may include a first base layer 100a, a first barrier layer 100b, a second base layer 100c, and a second barrier layer 100d sequentially stacked in a thickness direction (e.g., a z axis direction).

At least one of the first base layer 100a or the second base layer 100c may include the polymer resin. Each of the first barrier layer 100b and the second barrier layer 100d may include an inorganic insulating material such as silicon nitride, silicon oxide, or silicon oxynitride.

A buffer layer 201 may be located on the substrate 100. The buffer layer 201 may be configured to reduce or block foreign materials, moisture, or external air penetrating from below the substrate 100 and may provide a flat surface on the substrate 100. The buffer layer 201 may include an inorganic material such as silicon nitride, silicon oxide, or silicon oxynitride, an organic material, or an organic/inorganic composite material, and include a single layer or a multi-layer including an inorganic material and an organic material, the inorganic material including oxide or nitride.

The pixel circuit PC may be located on the buffer layer 201. The pixel circuit PC may include a thin-film transistor TFT and a storage capacitor Cst. The thin-film transistor TFT may include a semiconductor layer Act, a gate electrode GE, a source electrode SE, and a drain electrode DE, and the storage capacitor Cst may include the lower electrode CE1 and the upper electrode CE2.

The semiconductor layer Act may be arranged on the buffer layer 201. The semiconductor layer Act may include polycrystalline silicon. Alternatively, the semiconductor layer Act may include amorphous silicon, an oxide semi-conductor, or an organic semiconductor. The semiconductor layer Act may include a channel region, a drain region, and a source region, the drain region and the source region being on two opposite sides of the channel region.

The gate electrode GE may be located over the semicon-ductor layer Act. The gate electrode GE may overlap the channel region of the semiconductor layer Act. The gate electrode GE may include a low-resistance metal material. The gate electrode GE may include a conductive material including molybdenum (Mo), aluminum (Al), copper (Cu), and titanium (Ti) and have a single-layered structure or a multi-layered structure including the above materials.

A first gate insulating layer 203 may be located between the semiconductor layer Act and the gate electrode GE. The first gate insulating layer 203 may include an inorganic insulating material such as silicon oxide, silicon nitride, silicon oxynitride, aluminum oxide, titanium oxide, tanta-lum oxide, hafnium oxide, or zinc oxide. The first gate insulating layer 203 may include a single layer or a multi-layer including the inorganic insulating material.

A second gate insulating layer 204 may be located on the gate electrode GE to cover the gate electrode GE. The second gate insulating layer 204 may include an inorganic insulating material such as silicon oxide, silicon nitride, silicon oxynitride, aluminum oxide, titanium oxide, tanta-lum oxide, hafnium oxide, or zinc oxide. The second gate insulating layer 204 may include a single layer or a multi-layer including the inorganic insulating material.

The upper electrode CE2 of the storage capacitor Cst may be located on the second gate insulating layer 204. Because at least a portion of the upper electrode CE2 may overlap the gate electrode GE, the gate electrode GE may serve as the lower electrode CE1 of the storage capacitor Cst. As an example, the gate electrode GE may be integrally formed with the lower electrode CE1.

The upper electrode CE2 may include a conductive mate-rial including molybdenum (Mo), aluminum (Al), copper (Cu), and titanium (Ti) and have a single-layered structure or a multi-layered structure including the above materials.

An interlayer insulating layer 205 may be located on the upper electrode CE2. The interlayer insulating layer 205 may be formed to cover the upper electrode CE2 and may include silicon oxide, silicon nitride, or silicon oxynitride. The interlayer insulating layer 205 may include a single layer or a multi-layer including the inorganic insulating material. In the present specification, an inorganic insulating layer IIL includes the first gate insulating layer 203, the second gate insulating layer 204, and the interlayer insulat-ing layer 205.

The source electrode SE and the drain electrode DE are located on the interlayer insulating layer 205. The source electrode SE and the drain electrode DE may each include a conductive material including molybdenum (Mo), alumi-num (Al), copper (Cu), and titanium (Ti) and include a single layer or a multi-layer including the above materials. As an example, the source electrode SE and the drain electrode DE may have a multi-layered structure of Ti/Al/Ti. According to some embodiments, the source electrode SE or the drain electrode DE may be omitted. As an example, adjacent thin-film transistors TFT may be configured to share the source region or the drain region of the semicon-ductor layer Act. The source region or the drain region may serve as the source electrode SE or the drain electrode DE.

A first planarization layer 206 and a second planarization layer 207 may be sequentially arranged to cover the source electrode SE and the drain electrode DE. The first planar-ization layer 206 and the second planarization layer 207 may have a flat upper surface such that a pixel electrode 210 located thereon is formed flat.

The first planarization layer 206 and the second planar-ization layer 207 may include a general-purpose polymer such as benzocyclobutene (BCB), polyimide, hexamethyl-disiloxane (HMDSO), polymethylmethacrylate (PMMA) or polystyrene (PS), polymer derivatives having a phenol-based group, an acryl-based polymer, an imide-based poly-mer, an aryl ether-based polymer, an amide-based polymer, a fluorine-based polymer, a p-xylene-based polymer, or a vinyl alcohol-based polymer. Each of the first planarization layer 206 and the second planarization layer 207 may include a single layer or a multi-layer including the above organic insulating material. In the present specification, an organic insulating layer OIL includes the first planarization layer 206 and the second planarization layer 207.

A connection electrode CM may be located between the first planarization layer 206 and the second planarization layer 207. The connection electrode CM may be connected to the drain electrode DE of the thin-film transistor TFT through a contact hole defined in the first planarization layer 206. The connection electrode CM may include a conductive material including molybdenum (Mo), aluminum (Al), copper (Cu), and titanium (Ti) and have a single-layered structure or a multi-layered structure including the above materials.

Although it is shown in FIG. 7 that the organic insulating layer OIL includes two organic layers, the embodiments according to the present disclosure are not limited thereto. According to some embodiments, the organic insulating layer OIL may include only one organic layer. In this case, the connection electrode CM may be omitted, and the pixel electrode 210 of the organic light-emitting diode OLED may be directly connected to the drain electrode DE of the thin-film transistor TFT. According to some embodiments, the organic insulating layer OIL may include three or more organic layers. In this case, the connection electrode CM may be provided for each organic layer and may electrically connect the pixel electrode 210 of the organic light-emitting diode OLED and the drain electrode DE of the thin-film transistor TFT to each other.

The organic light-emitting diode OLED may be located on the second planarization layer 207. The organic light-emitting diode OLED may include the pixel electrode 210, an opposite electrode 230, and an intermediate layer 220 located between the pixel electrode 210 and the opposite electrode 230.

The pixel electrode 210 may be located on the second planarization layer 207. The pixel electrode 210 may be electrically connected to the connection electrode CM through a contact hole formed in the second planarization layer 207.

The pixel electrode 210 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. As an example, the pixel electrode 210 may have a structure including layers on/under the reflective layer, the layers including ITO, IZO, ZnO, or $In_2O_3$. In this case, the pixel electrode 210 may have a stack structure of ITO/Ag/ITO.

The pixel-defining layer 209 may be located on the second planarization layer 207 to cover the edges of the pixel electrode 210. The pixel-defining layer 209 may include a pixel opening exposing the central portion of the pixel electrode 210. The emission area of the organic light-emitting diode OLED, that is, the size and shape of the pixel are defined by the pixel opening.

The pixel-defining layer 209 may prevent arcs and the like from occurring at the edges of each pixel electrode 210 by increasing a distance between the edges of each pixel electrode 210 and the opposite electrode 230 over the pixel electrode 210. The pixel-defining layer 209 may include an organic insulating material such as polyimide, an acryl resin, benzocyclobutene, and hexamethyldisiloxane (HMDSO), and be formed by spin coating and the like.

The pixel-defining layer 209 may be formed in black. The pixel-defining layer 209 may include a light-blocking material and be provided in black. The light-blocking material may include carbon black, carbon nanotubes, a resin or paste including black dye, metal particles, for example, nickel (Ni), aluminum (Al), molybdenum (Mo), and an alloy thereof, metal oxide particles (e.g., chrome oxide) or metal nitride particles (e.g., chrome nitride). In the case where the pixel-defining layer 209 includes a light-blocking material, external light reflection by a metal structure arranged below the pixel-defining layer 209 may be reduced.

A spacer SPC may be located on the pixel-defining layer 209. The spacer SPC may include an organic insulating material such as polyimide, an acryl resin, benzocyclobutene, and hexamethyldisiloxane (HMDSO).

According to some embodiments, the spacer SPC may include the same material as that of the pixel-defining layer 209. The spacer SPC and the pixel-defining layer 209 may be simultaneously formed using a half-tone mask and the like.

The intermediate layer 220 may include an emission layer 222 arranged to correspond to the pixel opening of the pixel-defining layer 209. The emission layer 222 may include a polymer material or a low-molecular weight material and be configured to emit red, green, blue, or white light.

A first functional layer 221 and a second functional layer 223 may be respectively arranged under and/or on the emission layer 222. According to some embodiments, unlike the emission layer 222 patterned for each pixel, the first functional layer 221 and the second functional layer 223 may be integrally provided in the display area DA entirely.

The first functional layer 221 may include a single layer or a multi-layer. As an example, the first functional layer 221 may include a hole injection layer and/or a hole transport layer.

The second functional layer 223 may be omitted. The second functional layer 223 may include a single layer or a multi-layer. The second functional layer 223 may include an electron transport layer and/or an electron injection layer. According to some embodiments, at least one of a hole injection layer, a hole transport layer, an electron transport layer, or an electron injection layer may be omitted.

The intermediate layer 220 may have a single stack structure including a single emission layer, or a tandem structure, which is a multi-stack structure including a plurality of emission layers. In the case where the intermediate layer 220 has a tandem structure, a charge generation layer may be located between the plurality of stacks.

The opposite electrode 230 may include a conductive material having a relatively low work function. As an example, the opposite electrode 230 may include a (semi) transparent layer including silver (Ag), magnesium (Mg), aluminum (Al), nickel (Ni), chromium (Cr), lithium (Li), calcium (Ca) or an alloy thereof. Alternatively, the opposite electrode 230 may further include a layer on the (semi) transparent layer, the layer including ITO, IZO, ZnO, or $In_2O_3$. According to some embodiments, the opposite electrode 230 may include silver (Ag) and magnesium (Mg).

According to some embodiments, a capping layer CPL may be located on the opposite electrode 230. The capping layer CPL may be configured to improve a light-emission efficiency of the organic light-emitting diode OLED based on a constructive interference principle. The capping layer CPL may be an organic capping layer including an organic material, an inorganic capping layer including an inorganic material, or a composite capping layer including an organic material and an inorganic material. As an example, the capping layer CPL is a carbocyclic compound, a heterocyclic compound, an amine group-containing compound, porphine derivatives, phthalocyanine derivatives, naphthalocyanine derivatives, alkali metal complexes, alkali earth metal complexes, or an arbitrary combination thereof. Carbocyclic compounds, heterocyclic compounds, and amine group-containing compounds may optionally be substituted with substituents including O, N, S, Se, Si, F, Cl, Br, I, or an arbitrary combination thereof. According to some embodiments, the capping layer CPL may include lithium fluoride (LiF).

An encapsulation layer 300 may be located on the capping layer CPL to cover the organic light-emitting diode OLED. According to some embodiments, the encapsulation layer 300 may include at least one inorganic encapsulation layer and at least one organic encapsulation layer. As an example, the encapsulation layer 300 may include a first inorganic encapsulation layer 310, a second inorganic encapsulation layer 330, and an organic encapsulation layer 320.

The first and second inorganic encapsulation layers 310 and 330 may each include at least one inorganic insulating materials. The inorganic insulating material may include silicon oxide, silicon nitride, or silicon oxynitride. The first and second inorganic encapsulation layers 310 and 330 may each be formed by chemical vapor deposition.

The organic encapsulation layer 320 may further include polyethylene terephthalate, polyethylene naphthalate, polycarbonate, polyimide, polyethylene sulfonate, polyoxymethylene, polyarylate, hexamethyldisiloxane, an acrylic resin, or a combination thereof. The organic encapsulation layer 320 may provide a flat upper surface. Accordingly, even in the case where the input sensing layer 400 (see FIG. 2) is formed on the display layer 200 (see FIG. 2) by a successive process, a defect rate may be reduced.

The encapsulation layer 300 may cover the display area DA entirely, extend to the peripheral area PA and the intermediate area MA, and be arranged to cover at least a portion of the peripheral area PA and at least a portion of the intermediate area MA.

Figure 8:
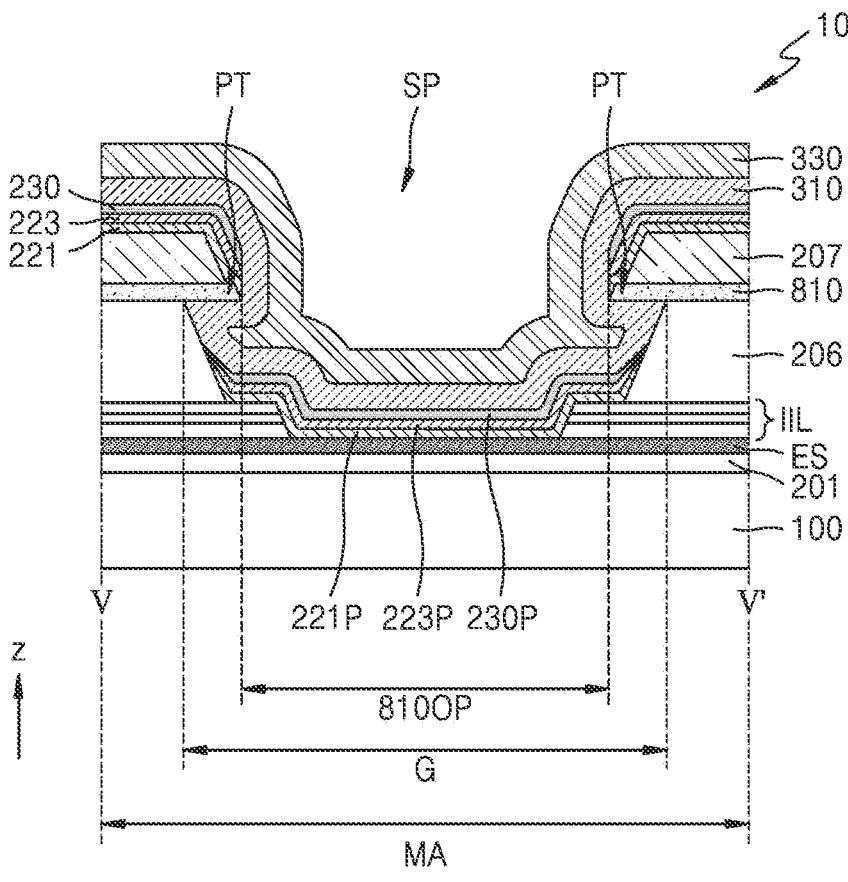
FIG. 8 is a schematic cross-sectional view of the display panel of FIG. 6, taken along the line V-V' of FIG. 6.

FIG. 8 is a schematic cross-sectional view of the display panel 10 of FIG. 6, taken along the line V-V' of FIG. 6.

Referring to FIG. 8, the display panel 10 may include the substrate 100 and the separator SP formed on the substrate 100. In other words, the separator SP may be arranged in the intermediate area MA of the substrate 100.

The buffer layer 201 and the inorganic insulating layer IIL may be located on the substrate 100. As described with reference to FIG. 7, the inorganic insulating layer IIL may include the first gate insulating layer 203, the second gate insulating layer 204, and the interlayer insulating layer 205.

The inorganic insulating layer IIL may define a hole or a groove surrounding the opening area OA. In the present specification, a groove denotes a portion cut in the thickness direction from the upper surface of a layer by removing a portion of the layer. In a plan view, a hole or a groove of the inorganic insulating layer IIL may have a closed loop shape surrounding the opening area OA.

An etch stopper ES may be located between the inorganic insulating layer IIL and the substrate 100. With regard to this, although it is shown in FIG. 8 that the etch stopper ES is located between the buffer layer 201 and the inorganic insulating layer IIL, the embodiments according to the present disclosure are not limited thereto. According to some embodiments, the etch stopper ES may be located between the substrate 100 and the buffer layer 201. According to some embodiments, the etch stopper ES may be located between the first gate insulating layer 203 (see FIG. 7) and the second gate insulating layer 204 (see FIG. 7) constituting the inorganic insulating layer IIL.

According to some embodiments, the etch stopper ES may include an oxide-based semiconductor material or a metal material. The etch stopper ES may be configured to protect a layer located under the etch stopper ES during an etch process of forming a hole or a groove defined in the inorganic insulating layer IIL. The bottom surface of a hole or a groove defined in the inorganic insulating layer IIL may be the same surface as the upper surface of the etch stopper ES.

The first organic insulating layer may be located on the inorganic insulating layer IIL. The first organic insulating layer may include the same material as a material of the first planarization layer 206. In the present specification, "A and B include the same material" may represent A and B are portions of a film or a layer formed by the same process, or portions formed by patterning a film or a layer formed by the same process. Accordingly, A and B may have the same composition, layer structure, and film quality. As an example, the first organic insulating layer may be a portion of the first planarization layer 206 arranged in the intermediate area MA.

The first planarization layer 206 may define a hole arranged in the intermediate area MA. A hole defined in the first planarization layer 206 and a hole or a groove defined in the inorganic insulating layer IIL may overlap each other to form a first groove G. In a plan view, the first groove G may form a closed loop surround the opening area OA.

A metal layer 810 may be located on the first planarization layer 206. The metal layer 810 may include a conductive material including molybdenum (Mo), aluminum (Al), copper (Cu), and titanium (Ti) and have a single-layered structure or a multi-layered structure including the above materials. According to some embodiments, the metal layer 810 may include the same material as a material of the connection electrode CM (see FIG. 7).

The metal layer 810 may define a first hole 810OP overlapping the first groove G. In this case, the metal layer 810 and the first planarization layer 206 may have an undercut structure in which the width of the first hole 810OP is less than the width of the first groove G. Accordingly, the metal layer 810 may have a tip PT extending in a direction from the upper surface of the first planarization layer 206 to the center of the first groove G. The tip PT is a kind of eaves portion and may protrude from a lateral surface of the first planarization layer 206 forming the inner surface of the first groove G to the center of the first groove G.

A second organic insulating layer may be located on the metal layer 810. The second organic insulating layer may include the same material as a material of the second planarization layer 207. As an example, the second organic insulating layer may be a portion of the second planarization layer 207 arranged in the intermediate area MA. The second planarization layer 207 may define a hole overlapping the first groove G.

A portion of the layers included in the organic light-emitting diode OLED, for example, the first functional layer 221 and the second functional layer 223 may be disconnected by the structure of the separator SP including the tip PT and the first groove G. As an example, a portion 221P of the first functional layer 221 and a portion 223P of the second functional layer 223 located on the bottom surface of the first groove G may be apart and separated from the first functional layer 221 and the second functional layer 223 located on the tip PT.

Likewise, the opposite electrode 230 included in the organic light-emitting diode OLED may be disconnected by the structure of the separator SP including the tip PT and the first groove G. As an example, a portion 230P of the opposite electrode 230 located on the bottom surface of the first groove G may be apart and separated from the opposite electrode 230 located on the tip PT.

Moisture and/or external air may progress toward the display area DA (see FIG. 6) through the lateral surface of the through hole 10OP (see FIG. 6). The organic material layers successively formed, for example, the first functional layer 221 and the second functional layer 223 may serve as penetration paths of moistures and the like. However, because the first functional layer 221 and the portion 221P of the first functional layer 221, and the second functional layer 223 and the portion 223P of the second functional layer 223 are separated from each other by the separator SP, moisture and the like progressing toward the display area DA (see FIG. 6) may be reduced or prevented.

The first inorganic encapsulation layer 310 may be located on the opposite electrode 230. Because the first inorganic encapsulation layer 310 may be formed through chemical vapor deposition and has a relatively excellent step coverage, the first inorganic encapsulation layer 310 may continuously cover the lower surface of the tip PT and the inner surface of the first groove G.

The second inorganic encapsulation layer 330 may be located on the first inorganic encapsulation layer 310. The second inorganic encapsulation layer 330 may be in direct contact with the first inorganic encapsulation layer 310 on the inner surface of the first groove G.

Figure 9:
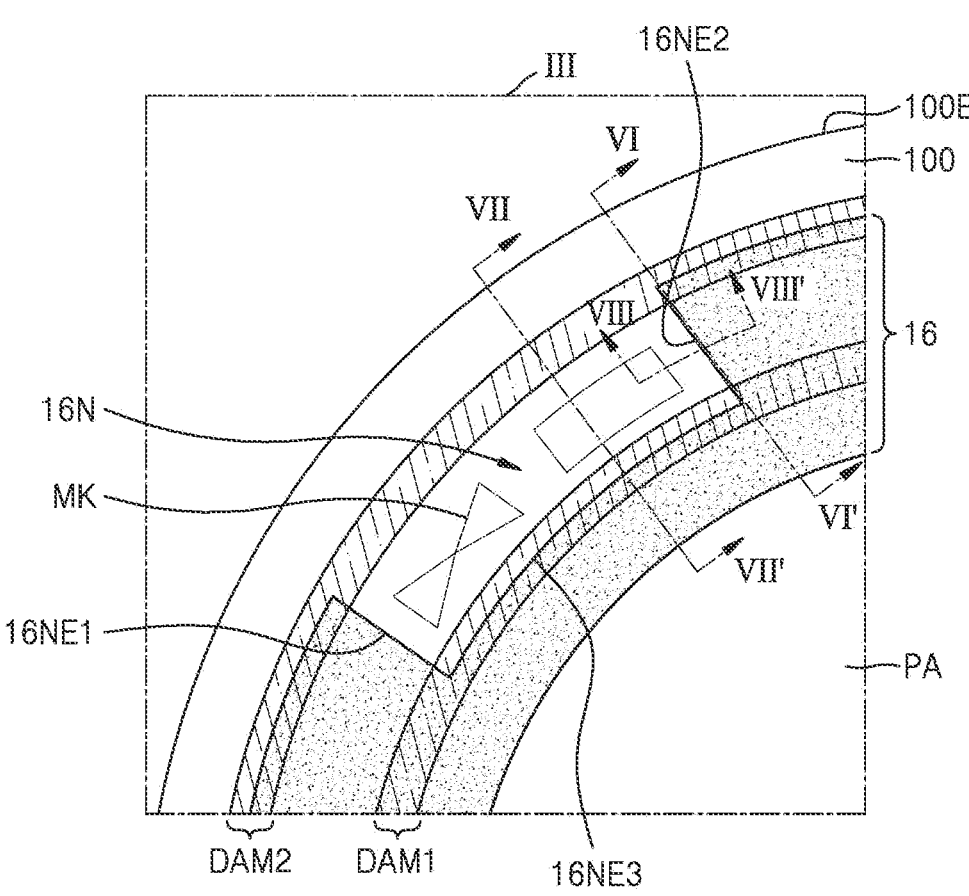
FIG. 9 is a schematic plan view of a region III of the display panel shown in FIG. 3.

FIG. 9 is a schematic plan view of a region III of the display panel 10 shown in FIG. 3.

Referring to FIG. 9, the common power supply line 16 may be arranged in the peripheral area PA. The common power supply line 16 may be apart toward the display area DA (see FIG. 3) from an edge 100E of the substrate 100 and be arranged parallel to the edge 100E of the substrate 100. As described above, the common power supply line 16 may have a loop shape having one open side and partially surrounding the display area DA (see FIG. 3).

A first dam DAM1 may be arranged to overlap the common power supply line 16. In a plan view, the first dam DAM1 may be arranged between the outer boundary of the common power supply line 16 and the inner boundary of the common power supply line 16. Here, the outer boundary of the common power supply line 16 means the boundary of the common power supply line 16 close to the edge 100E of the substrate 100, and the inner boundary of the common power supply line 16 means the boundary of the common power supply line 16 close to the display area DA (see FIG. 3). The first dam DAM1 may surround at least a portion of the display area DA (see FIG. 3).

A second dam DAM2 may be arranged outside the first dam DAM1. In a plan view, the second dam DAM2 may overlap the outer boundary of the common power supply line 16. In other words, the outer boundary of the common power supply line 16 may be covered by the second dam DAM2. The second dam DAM2 may surround at least a portion of the first dam DAM1.

Each of the first dam DAM1 and the second dam DAM2 may include a plurality of organic layers. The first dam DAM1 may be configured to control a flow of monomer while the organic encapsulation layer 320 (see FIG. 7) is formed. Accordingly, the end of the organic encapsulation layer 320 (see FIG. 7) is located on the first dam DAM1 and does not extend toward the edge 100E of the substrate 100 beyond the first dam DAM1. Accordingly, the second inorganic encapsulation layer 330 (see FIG. 7) may be in direct contact with the first inorganic encapsulation layer 310 (see FIG. 7) to form an inorganic contact region between the edge 100E of the substrate 100 and the first dam DAM1.

The common power supply line 16 may define a notch 16N. In a plan view, the notch 16N may have a loop shape including one open side formed by inwardly bending the outer boundary of the common power supply line 16.

As an example, the notch 16N may include a first boundary 16NE1, a second boundary 16NE2, and a third boundary 16NE3, wherein the first boundary 16NE1 directed from the first dam DAM1 to the second dam DAM2, the second boundary 16NE2 faces the first boundary 16NE1 and is arranged parallel to the first boundary 16NE1, and the third boundary 16NE3 connects the first boundary 16NE1 and the second boundary 16NE2 to each other.

In this case, in a plan view, a portion of the first boundary 16NE1 and a portion of the second boundary 16NE2 may not overlap the first dam DAM1 and the second dam DAM2. In contrast, the third boundary 16NE3 may be arranged to overlap the first dam DAM1. That is, a portion of the boundary of the notch 16N may be arranged between the first dam DAM1 and the second dam DAM2.

A metal pattern MK may be arranged in the peripheral area PA to overlap the notch 16N. In a plan view, the metal pattern MK may be located inside the notch 16N and be apart from the common power supply line 16. In other words, the metal pattern MK may not overlap the common power supply line 16. An element including a metal material except the metal pattern MK may not be arranged in a region of the common power supply line 16 in which the notch 16N is arranged. Accordingly, the notch 16N may serve as an alignment mark detection region.

Figure 10:
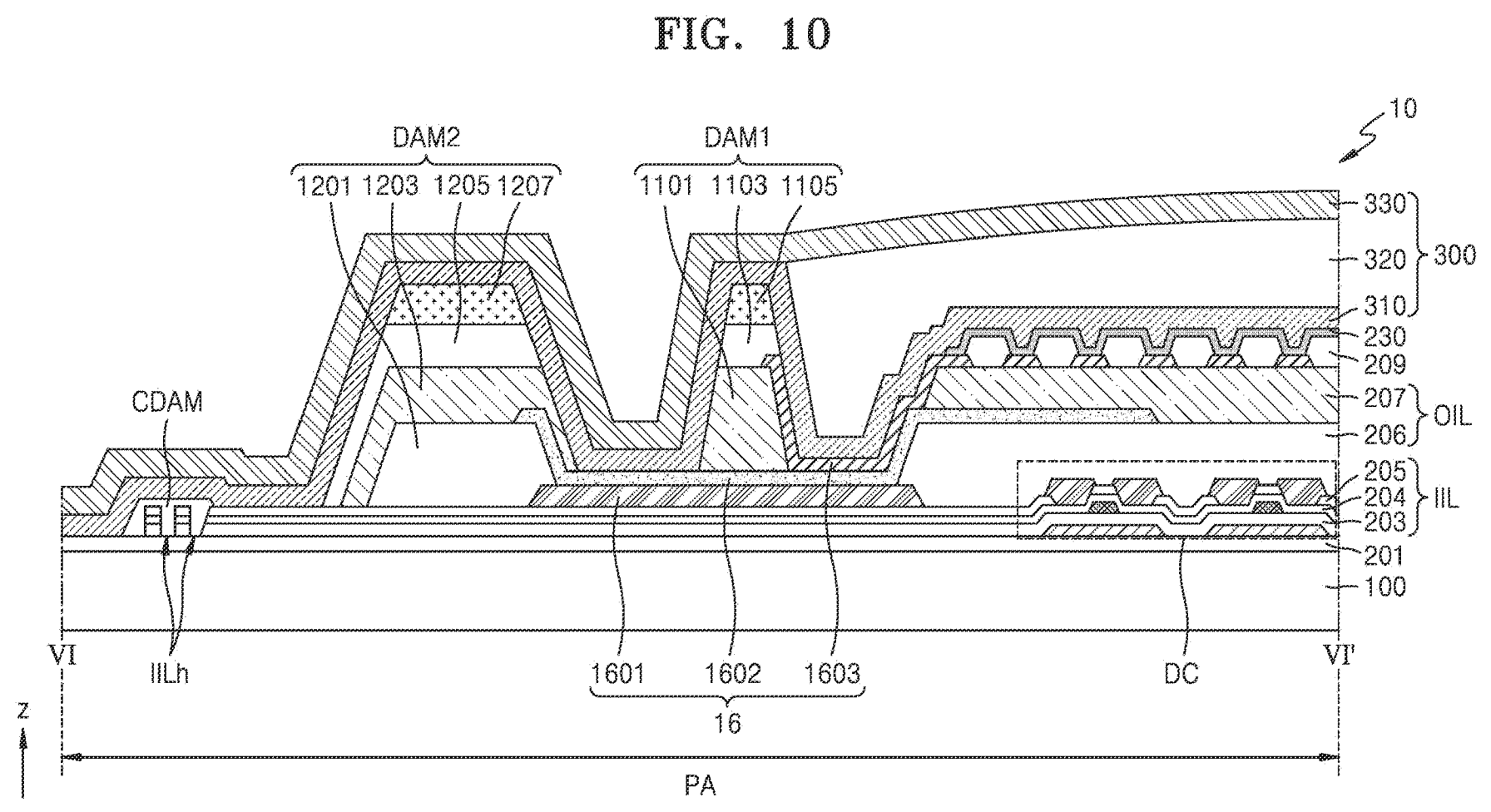
Figure 11:
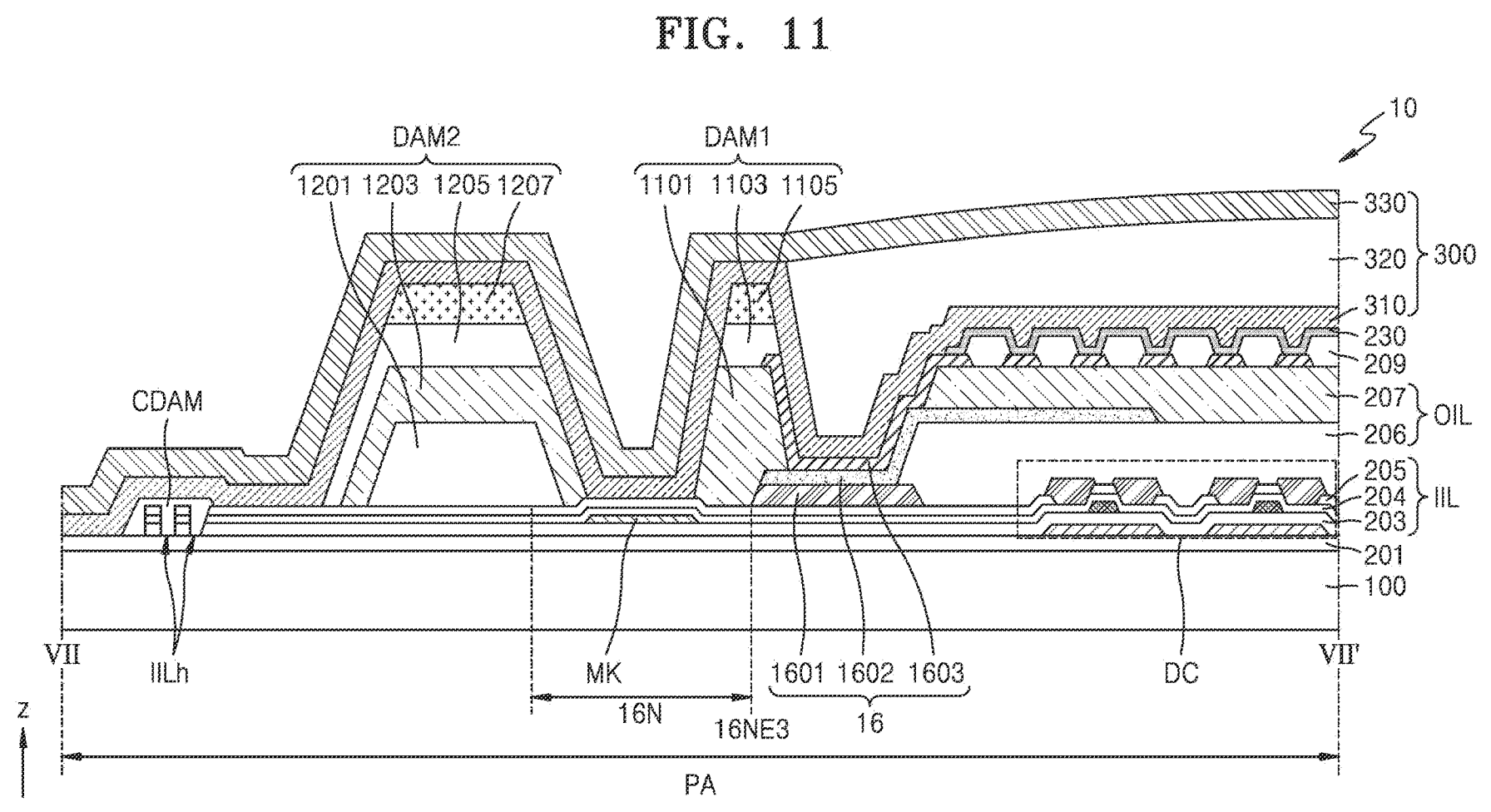
Figure 12:
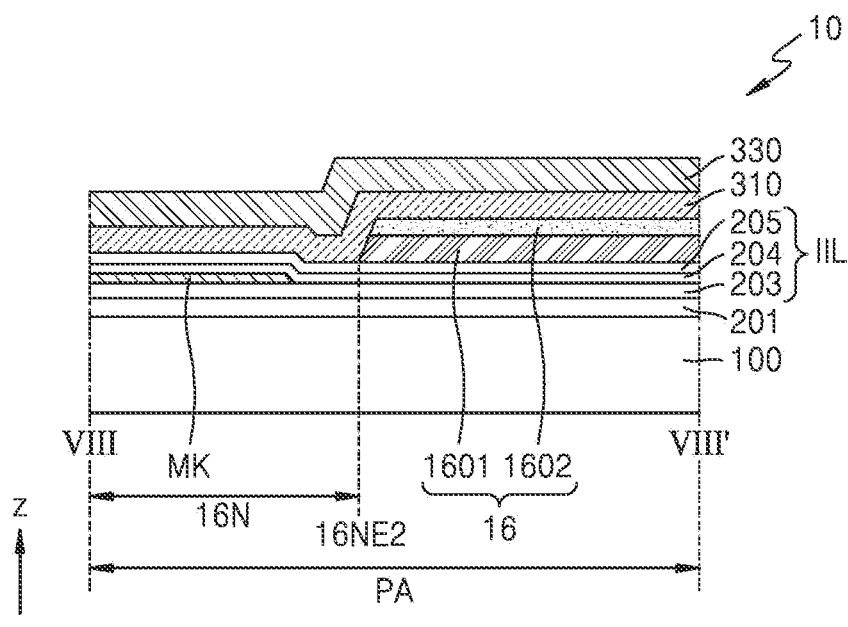
FIG. 12 is a schematic cross-sectional view of the display panel of FIG. 9, taken along the line VIII-VIII' of FIG. 9.

FIG. 10 is a schematic cross-sectional view of the display panel 10 of FIG. 9, taken along the line VI-VI' of FIG. 9, FIG. 11 is a schematic cross-sectional view of the display panel 10 of FIG. 9, taken along the line VII-VII' of FIG. 9, and FIG. 12 is a schematic cross-sectional view of the display panel 10 of FIG. 9, taken along the line VIII-VIII' of FIG. 9.

Referring to FIG. 10, a first dam DAM1, a second dam DAM2, and the common power supply line 16 may be arranged in the peripheral area PA of the substrate 100. FIG. 10 shows a cross-section of a region adjacent to the second boundary 16NE2 (see FIG. 9) of the notch 16N (see FIG. 9).

The buffer layer 201 may be located on the substrate 100. A driving circuit DC may be located on the buffer layer 201. According to some embodiments, the driving circuit DC may include a plurality of transistors.

The inorganic insulating layer IIL may be located on the buffer layer 201. The inorganic insulating layer IIL may include a first gate insulating layer 203, a second gate insulating layer 204, and an interlayer insulating layer 205. The inorganic insulating layer IIL may include a plurality of inorganic holes IILh adjacent to the edge 100E (see FIG. 9) of the substrate 100.

The inorganic holes IILh may prevent or reduce cracks from propagating to the display area DA (see FIG. 3) due to the inorganic insulating layer, wherein the cracks occur from the edge 100E (see FIG. 9) of the substrate 100. In a plan view, a crack dam CDAM may be arranged to overlap the inorganic holes IILh. The crack dam CDAM may include at least one organic layer.

The common power supply line 16 may be located on the inorganic insulating layer IIL. According to some embodiments, the common power supply line 16 may include different metal layers. As an example, the common power supply line 16 may include a first wiring layer 1601, a second wiring layer 1602, and a third wiring layer 1603. However, the embodiments according to the present disclosure are not limited thereto. According to some embodiments, some of the first wiring layer 1601, the second wiring layer 1602, and the third wiring layer 1603 may be omitted.

In a plan view, the first dam DAM1 may be arranged to overlap the common power supply line 16. The first dam DAM1 may be apart from the ends of the first planarization layer 206 and the second planarization layer 207.

The first dam DAM1 may include a plurality of organic layers. As an example, the first dam DAM1 may include a (1-1)st organic layer 1101, a (1-2)nd organic layer 1103, and a (1-3)rd organic layer 1105. According to some embodiments, some of the (1-1)st organic layer 1101, the (1-2)nd organic layer 1103, and the (1-3)rd organic layer 1105 may be omitted, or the first dam DAM1 may further include an organic layer or an inorganic layer. According to some embodiments, the (1-1)st organic layer 1101 may include the same material as a material of the second planarization layer 207, the (1-2)nd organic layer 1103 may include the same material as a material of the pixel-defining layer 209, and the (1-3)rd organic layer 1105 may include the same material as a material of the spacer SPC (see FIG. 7).

The second dam DAM2 may be arranged outside the first dam DAM1 to surround first dam DAM1. In a plan view, the second dam DAM2 may overlap the outer boundary of the common power supply line 16.

The second dam DAM2 may include a plurality of organic layers. As an example, the second dam DAM2 may include a (2-1)st organic layer 1201, a (2-2)nd organic layer 1203, a (2-3)rd organic layer 1205, and a (2-4)th organic layer 1207. According to some embodiments, some of the (2-1)st organic layer 1201, the (2-2)nd organic layer 1203, the (2-3)rd organic layer 1205, and the (2-4)th organic layer 1207 may be omitted, or the second dam DAM2 may further include an organic layer or an inorganic layer. The (2-1)st organic layer 1201 may include the same material as a material of the first planarization layer 206, the (2-2)nd organic layer 1203 may include the same material as a material of the second planarization layer 207, the (2-3)rd organic layer 1205 may include the same material as a material of the pixel-defining layer 209, and the (2-4)th organic layer 1207 may include the same material as a material of the spacer SPC (see FIG. 7).

The first wiring layer 1601 may be located between the inorganic insulating layer IIL and the first planarization layer 206 and the (2-1)st organic layer 1201 of the second dam DAM2. The first wiring layer 1601 may include the same material as a material of the source electrode SE and the drain electrode DE of the thin-film transistor TFT (see FIG. 7). The inner boundary of the first wiring layer 1601 may be covered by the first planarization layer 206, and the outer boundary of the first wiring layer 1601 may be covered by the (2-1)st organic layer 1201 of the second dam DAM2.

The second wiring layer 1602 may be located on the first wiring layer 1601. The second wiring layer 1602 may include the same material as a material of the connection electrode CM (see FIG. 7). The inner boundary of the second wiring layer 1602 may be located between the first planarization layer 206 and the second planarization layer 207, and the outer boundary of the second wiring layer 1602 may be located between the (2-1)st organic layer 1201 and the (2-2)nd organic layer 1203 of the second dam DAM2. A portion of the second wiring layer 1602 may be in direct contact with the first wiring layer 1601.

The third wiring layer 1603 may be located on the second wiring layer 1602. The third wiring layer 1603 may include the same material as a material of the pixel electrode 210 (see FIG. 7) of the organic light-emitting diode OLED (see FIG. 7). The inner boundary of the third wiring layer 1603 may be located between the second planarization layer 207 and the pixel-defining layer 209, and the outer boundary of the third wiring layer 1603 may be located between the (1-1)st organic layer 1101 and the (1-2)nd organic layer 1103 of the first dam DAM1.

Accordingly, the outer boundaries and the inner boundaries of the first wiring layer 1601, the second wiring layer 1602, and the third wiring layer 1603 of the common power supply line 16 may be covered by a layer including an organic material.

A plurality of holes may be provided to discharge impurities such as gas occurring from the second planarization layer 207 located under the third wiring layer 1603. The pixel-defining layer 209 may be located on the third wiring layer 1603, and the opposite electrode 230 may be located on the pixel-defining layer 209. The pixel-defining layer 209 may include a plurality of holes exposing the upper surface of the third wiring layer 1603. The opposite electrode 230 may be in contact with the third wiring layer 1603 through the plurality of holes of the pixel-defining layer 209.

The encapsulation layer 300 may be located on the opposite electrode 230. The encapsulation layer 300 may include the first inorganic encapsulation layer 310, the second inorganic encapsulation layer 330, and the organic encapsulation layer 320 located between the first inorganic encapsulation layer 310 and the second inorganic encapsulation layer 330.

The first inorganic encapsulation layer 310 may be formed on the entire surface of the substrate 100. The first inorganic encapsulation layer 310 may continuously cover the upper surface and the lateral surface of each of the first dam DAM1 and the second dam DAM2.

In the peripheral area PA, the organic encapsulation layer 320 may be discontinuous due to the structure of the first dam DAM1. As an example, the end of the organic encapsulation layer 320 may be located on the first dam DAM1, and the organic encapsulation layer 320 may not be arranged in a region between the first dam DAM1 and the second dam DAM2. The second inorganic encapsulation layer 330 may be in direct contact with the first inorganic encapsulation layer 310 to form an inorganic contact region on the upper surface of the first dam DAM1 and outside the first dam DAM1.

Referring to FIG. 11, the common power supply line 16 may define the notch 16N. The notch 16N may be formed by overlapping the opening of the first wiring layer 1601, the opening of the second wiring layer 1602, and the opening of the third wiring layer 1603. The third boundary 16NE3 of the notch 16N may overlap the first dam DAM1. In other words, the edge of the first wiring layer 1601 and the edge of the second wiring layer 1602 constituting the third boundary 16NE3 may be covered by the (1-1)st organic layer 1101 of the first dam DAM1. The edge of the third wiring layer 1603 may be covered by the (1-2)nd organic layer 1103 of the first dam DAM1.

The metal pattern MK may be located in the notch 16N of the common power supply line 16. The metal pattern MK may be arranged in a region between the first dam DAM1 and the second dam DAM2. A portion of the metal pattern MK may overlap the second dam DAM2.

The metal pattern MK may be located on a layer different from the common power supply line 16 and sufficiently insulated from the common power supply line 16. As an example, at least one inorganic insulating layer may be located between the metal pattern MK and the common power supply line 16. According to some embodiments, the metal pattern MK may be located between the first gate insulating layer 203 and the second gate insulating layer 204. In this case, the metal pattern MK may include the same material as a material of the gate electrode GE (see FIG. 7) of the thin-film transistor TFT (see FIG. 7).

In a plan view, the metal pattern MK may be arranged apart from the common power supply line 16 and be an island pattern not electrically connected to another element. As described above, in a plan view, an element including a metal material except the metal pattern MK may not be arranged in a region overlapping the notch 16N of the common power supply line 16. Accordingly, the notch 16N may serve as an alignment mark detection region.

Referring to FIG. 12, the metal pattern MK may be arranged inside the notch 16N of the common power supply line 16. The metal pattern MK may be apart from the common power supply line 16 by the notch 16N, located on a layer different from the common power supply line 16, and sufficiently insulated from the common power supply line 16.

Although the common power supply line 16 may include the first wiring layer 1601 and the second wiring layer 1602 in a region between the first dam DAM1 and the second dam DAM2, the embodiments according to the present disclosure are not limited thereto. According to some embodiments, the third wiring layer 1603 of the common power supply line 16 may extend to the second dam DAM2, and the common power supply line 16 may include the first wiring layer 1601, the second wiring layer 1602, and the third wiring layer 1603 in a region between the first dam DAM1 and the second dam DAM2.

An organic material layer including an organic material may not be located between the inorganic insulating layer IIL and the first inorganic encapsulation layer 310 in the region between the first dam DAM1 and the second dam DAM2. Accordingly, a portion of the second boundary 16NE2 of the notch 16N extending in a direction from the first dam DAM1 to the second dam DAM2 may not be covered by the organic material layer but may be in direct contact with the first inorganic encapsulation layer 310.

In the case where the organic material layer is located between the inorganic insulating layer IIL and the first inorganic encapsulation layer 310 in the region between the first dam DAM1 and the second dam DAM2, moisture and the like from the outer side of the edge 100E (see FIG. 9) of the substrate 100 may penetrate the display area DA along the organic material layer. Accordingly, the boundary of the notch 16N of the common power supply line 16 arranged between the first dam DAM1 and the second dam DAM2 may not be covered by the organic material layer but may be in contact with the first inorganic encapsulation layer 310.

FIGS. 13 to 17 are schematic cross-sectional views showing some of operations of a method of manufacturing a display panel according to some embodiments.

Figure 13:
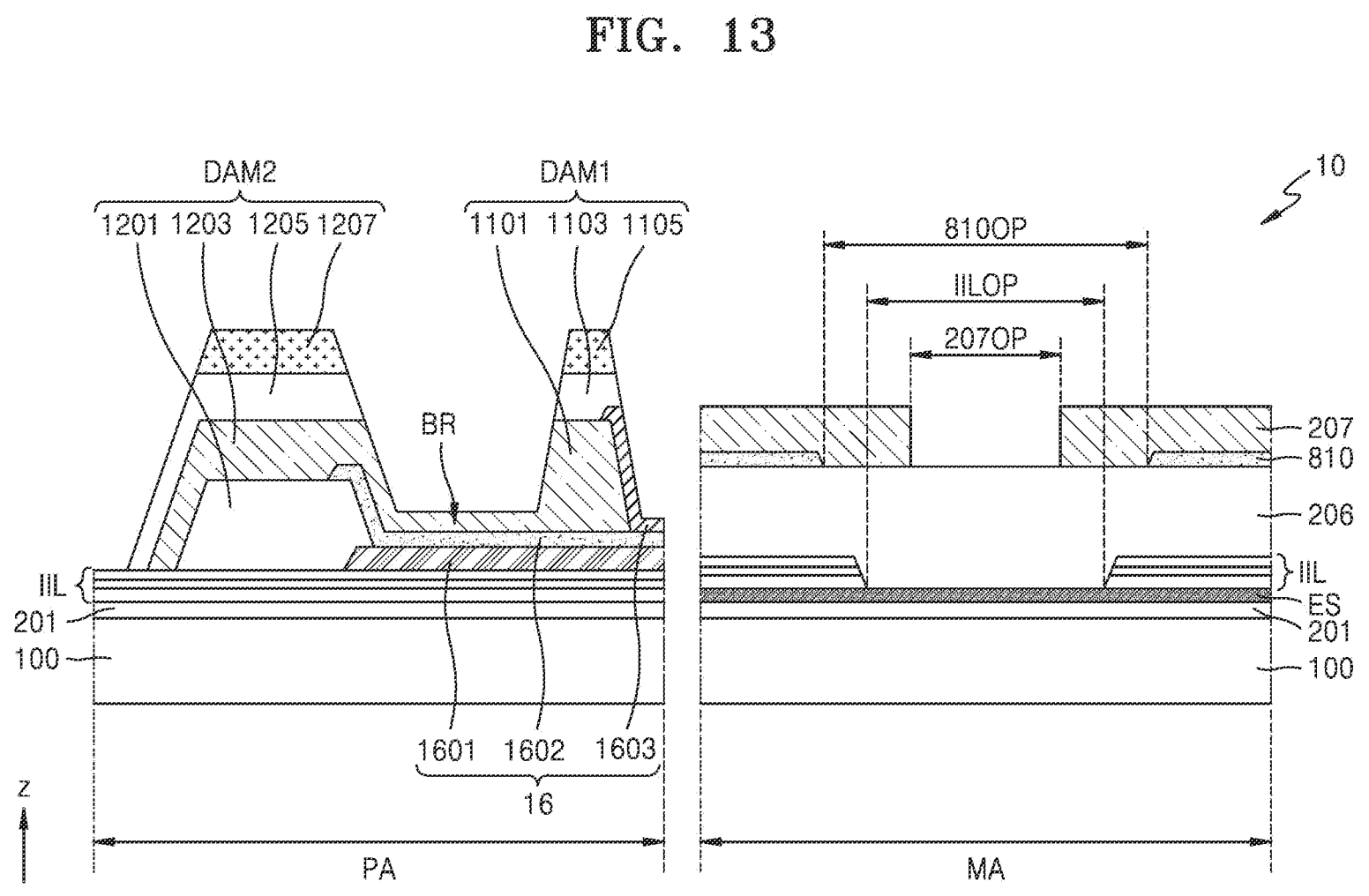

Referring to FIG. 13, the common power supply line 16, the first dam DAM1, and the second dam DAM2 may be arranged in the peripheral area PA of the substrate 100, the first planarization layer 206 (or the first organic insulating layer), the second planarization layer 207 (or the second organic insulating layer), and the metal layer 810 may be arranged in the intermediate area MA of the substrate 100, wherein the metal layer 810 is located between the first planarization layer 206 and the second planarization layer 207.

The buffer layer 201 and the inorganic insulating layer IIL may be sequentially stacked in the peripheral area PA of the substrate 100. The common power supply line 16 may be located on the inorganic insulating layer IIL, and the common power supply line 16 may include the first wiring layer 1601, the second wiring layer 1602, and the third wiring layer 1603.

The first dam DAM1 may be formed to overlap the common power supply line 16 in a plan view, and the second dam DAM2 may be formed to overlap the outer boundary of the common power supply line 16 in a plan view.

Each of the first dam DAM1 and the second dam DAM2 may include a plurality of organic layers. As an example, the first dam DAM1 may include the (1-1)st organic layer 1101, the (1-2)nd organic layer 1103, and the (1-3)rd organic layer 1105. The (1-1)st organic layer 1101 may be formed on the second wiring layer 1602 of the common power supply line 16. The (1-2)nd organic layer 1103 may be formed on the (1-1)st organic layer 1101, and the outer boundary of the third wiring layer 1603 may be located between the (1-1)st organic layer 1101 and the (1-2)nd organic layer 1103. The (1-3)rd organic layer 1105 may be formed on the (1-2)nd organic layer 1103.

The second dam DAM2 may include the (2-1)st organic layer 1201, the (2-2)nd organic layer 1203, the (2-3)rd organic layer 1205, and the (2-4)th organic layer 1207. The (2-1)st organic layer 1201 may cover the outer boundary of the first wiring layer 1601 of the common power supply line 16. The (2-2)nd organic layer 1203 may be formed on the (2-1)st organic layer 1201 and may cover the outer boundary of the second wiring layer 1602. The (2-3)rd organic layer 1205 and the (2-4)th organic layer 1207 may be formed on the (2-2)nd organic layer 1203.

The common power supply line 16 may define the notch 16N (see FIG. 9). A portion of the boundary of the notch 16N arranged in the region between the first dam DAM1 and the second dam DAM2 may be covered by an organic bridge BR. In the case where the boundary of the notch 16N is exposed during the process of manufacturing the display panel 10, defects may occur due to precipitation of silver or the like along the boundary of the notch 16N due to moisture or the like. Accordingly, the organic bridge BR may be formed to overlap the boundary of the notch 16N arranged in the region between the first dam DAM1 and the second dam DAM2.

The organic bridge BR may connect the first dam DAM1 and the second dam DAM2 to each other. According to some embodiments, the organic bridge BR may include the same material as a material of the (1-1)st organic layer 1101 of the first dam DAM1 and the (2-2)nd organic layer 1203 of the second dam DAM2. As an example, the (1-1)st organic layer 1101 of the first dam DAM1 and the (2-2)nd organic layer 1203 of the second dam DAM2 may be integrally formed with the organic bridge BR.

The buffer layer 201 and the inorganic insulating layer IIL may be sequentially stacked in the intermediate area MA of the substrate 100. The etch stopper ES may be formed between the buffer layer 201 and the inorganic insulating layer IIL.

A hole or a groove surrounding the opening area OA (see FIG. 6) may be formed by removing a portion of the inorganic insulating layer IIL. With regard to this, it is shown in FIG. 13 that the inorganic insulating layer IIL defines a second hole IILOP passing through the inorganic insulating layer IIL.

During the process of forming the second hole IILOP, the etch stopper ES may be configured to protect a layer located under the etch stopper ES. According to some embodiments, the etch stopper ES may include an oxide-based semiconductor material or a metal material.

The first planarization layer 206 may be formed on the inorganic insulating layer IIL. The first planarization layer 206 may fill the second hole IILOP. According to some embodiments, the first planarization layer 206 may include the same material as a material of the (2-1)st organic layer 1201 of the second dam DAM2.

The metal layer 810 may be located on the first planarization layer 206. The metal layer 810 may define the first hole 810OP surrounding the opening area OA (see FIG. 6). The first hole 810OP of the metal layer 810 may overlap the second hole IILOP of the inorganic insulating layer IIL. The width of the second hole IILOP of the inorganic insulating layer IIL and the width of the first hole 810OP of the metal layer 810 may be the same or different from each other. With regard to this, FIG. 13 shows a structure in which the width of the first hole 810OP of the metal layer 810 is greater than the width of the second hole IILOP of the inorganic insulating layer IIL.

The second planarization layer 207 may be formed on the metal layer 810. According to some embodiments, the second planarization layer 207 may include the same material as a material of the (1-1)st organic layer 1101 of the first dam DAM1, the (2-2)nd organic layer 1203 of the second dam DAM2, and the organic bridge BR.

The second planarization layer 207 may define a first sub-hole 207OP overlapping the first hole 810OP of the metal layer 810. The first sub-hole 207OP may pass through the second planarization layer 207 to expose the upper surface of the first planarization layer 206. According to some embodiments, the width of the first sub-hole 207OP of the second planarization layer 207 may be less than the width of the first hole 810OP of the metal layer 810.

Figure 14:
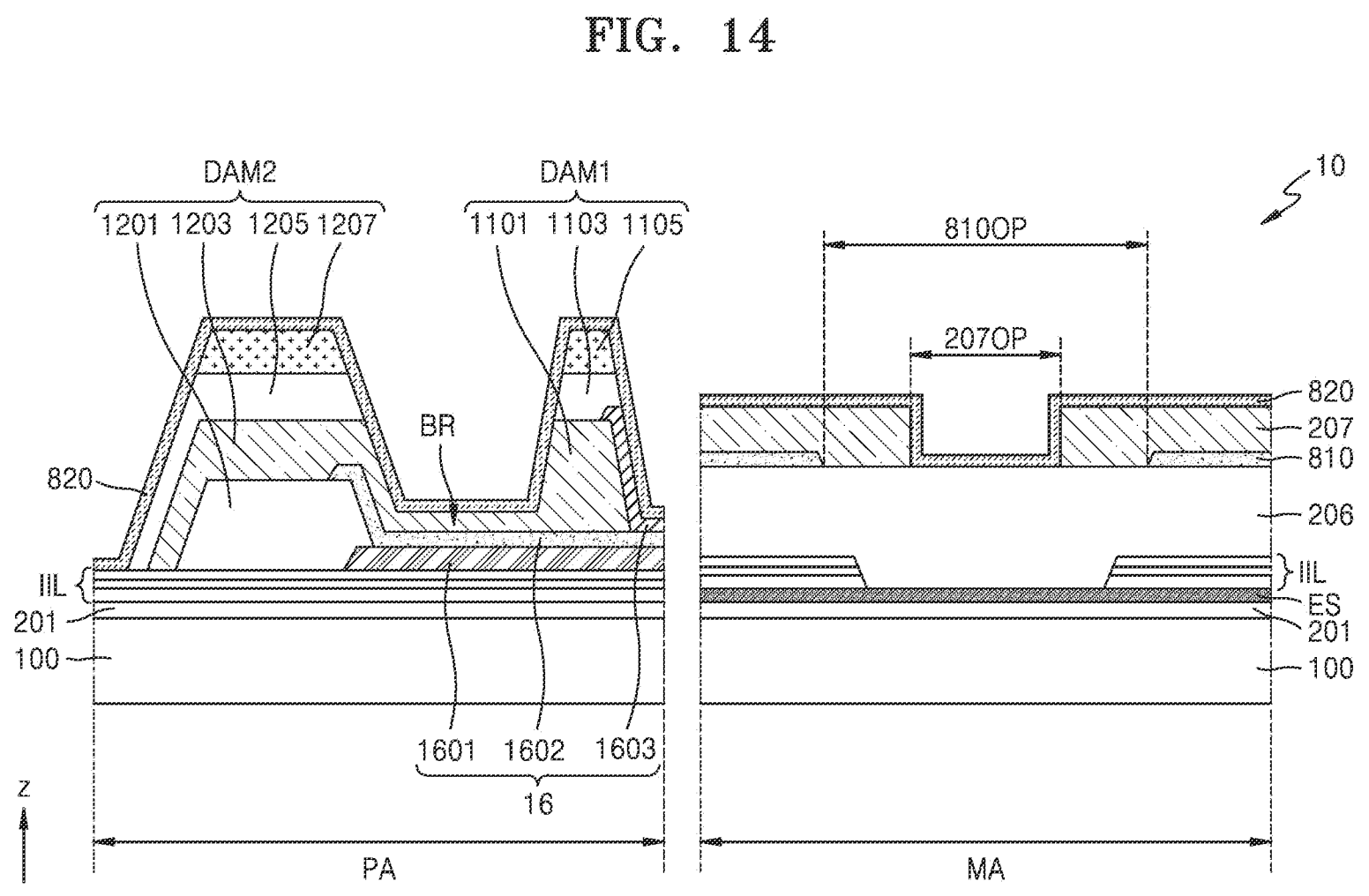

Referring to FIG. 14, a sacrificial layer 820 may be formed on the structure described with reference to FIG. 13. The sacrificial layer 820 may be formed in the peripheral area PA to cover the first dam DAM1, the second dam DAM2, and the organic bridge BR.

The sacrificial layer 820 may include a conductive oxide. As an example, the sacrificial layer 820 may include indium gallium zinc oxide (IGZO) or indium tin oxide (ITO).

The sacrificial layer 820 may be formed on the second planarization layer 207 and the first planarization layer 206 exposed through the first sub-hole 207OP of the second planarization layer 207 in the intermediate area MA. The sacrificial layer 820 may cover the inner surface of the first sub-hole 207OP and the exposed upper surface of the first planarization layer 206. The sacrificial layer 820 arranged in the intermediate area MA and the sacrificial layer 820 arranged in the peripheral area PA may be formed through the same process.

Figure 15:
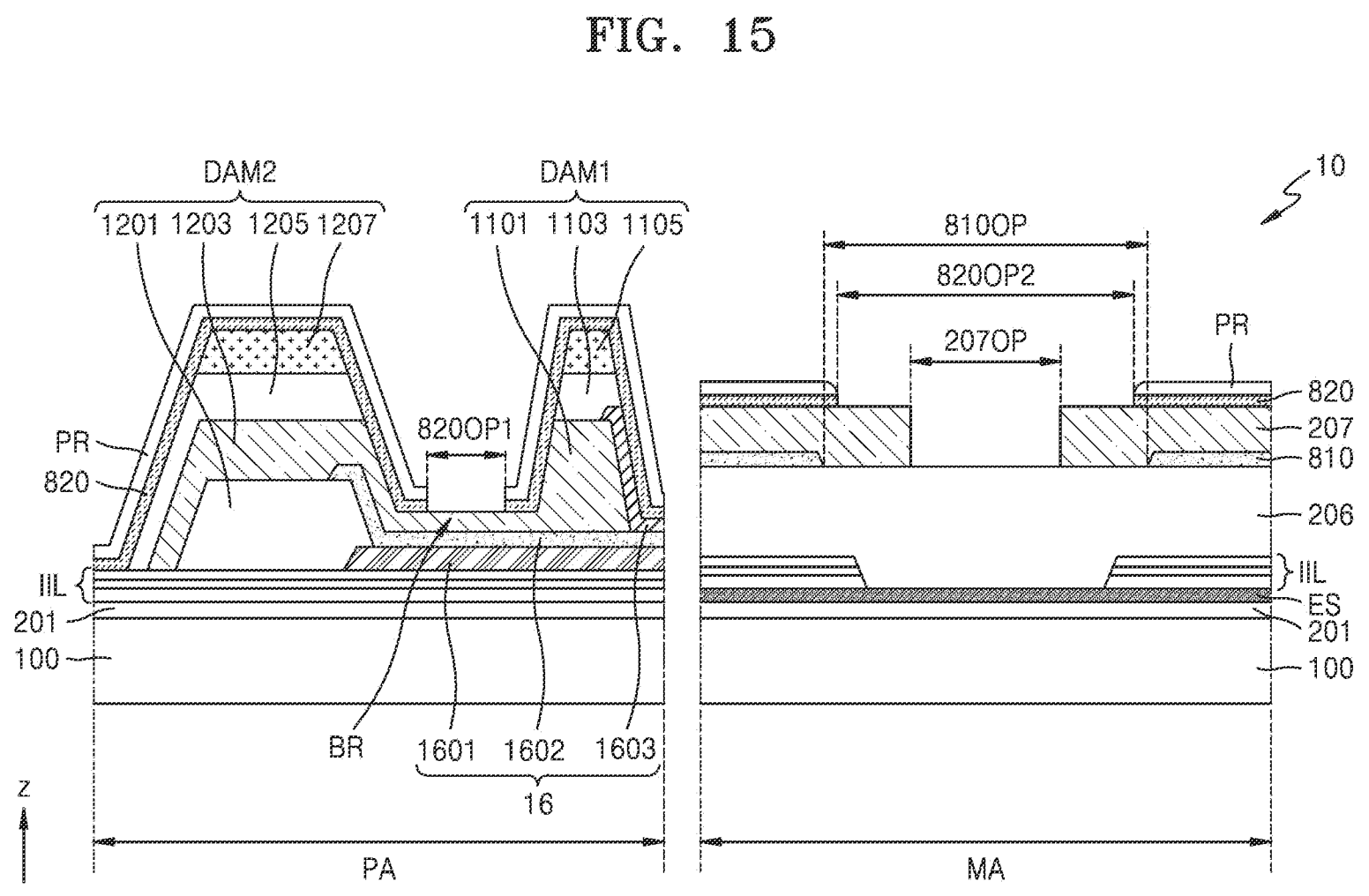

Referring to FIG. 15, in the structure described with reference to FIG. 14, a portion of the sacrificial layer 820 may be etched and removed using a photoresist PR as a mask.

The photoresist PR may be arranged in the peripheral area PA and the intermediate area MA. The photoresist PR may define an opening overlapping the organic bridge BR in the peripheral area PA. The photoresist PR may define an opening overlapping the first hole 810OP of the metal layer 810 in the intermediate area MA.

A portion of the sacrificial layer 820 exposed through the opening of the photoresist PR may be etched and removed. As an example, a second sub-hole 820OP1 overlapping the organic bridge BR may be formed by removing a portion of the sacrificial layer 820 overlapping the organic bridge BR in the peripheral area PA. A third sub-hole 820OP2 overlapping the first hole 810OP may be formed by removing a portion of the sacrificial layer 820 overlapping the first hole 810OP in the intermediate area MA. A portion of the sacrificial layer 820 overlapping the organic bridge BR and a portion of the sacrificial layer 820 overlapping the first hole 810OP may be removed through the same process.

Then, the photoresist PR may be removed.

Figure 16:
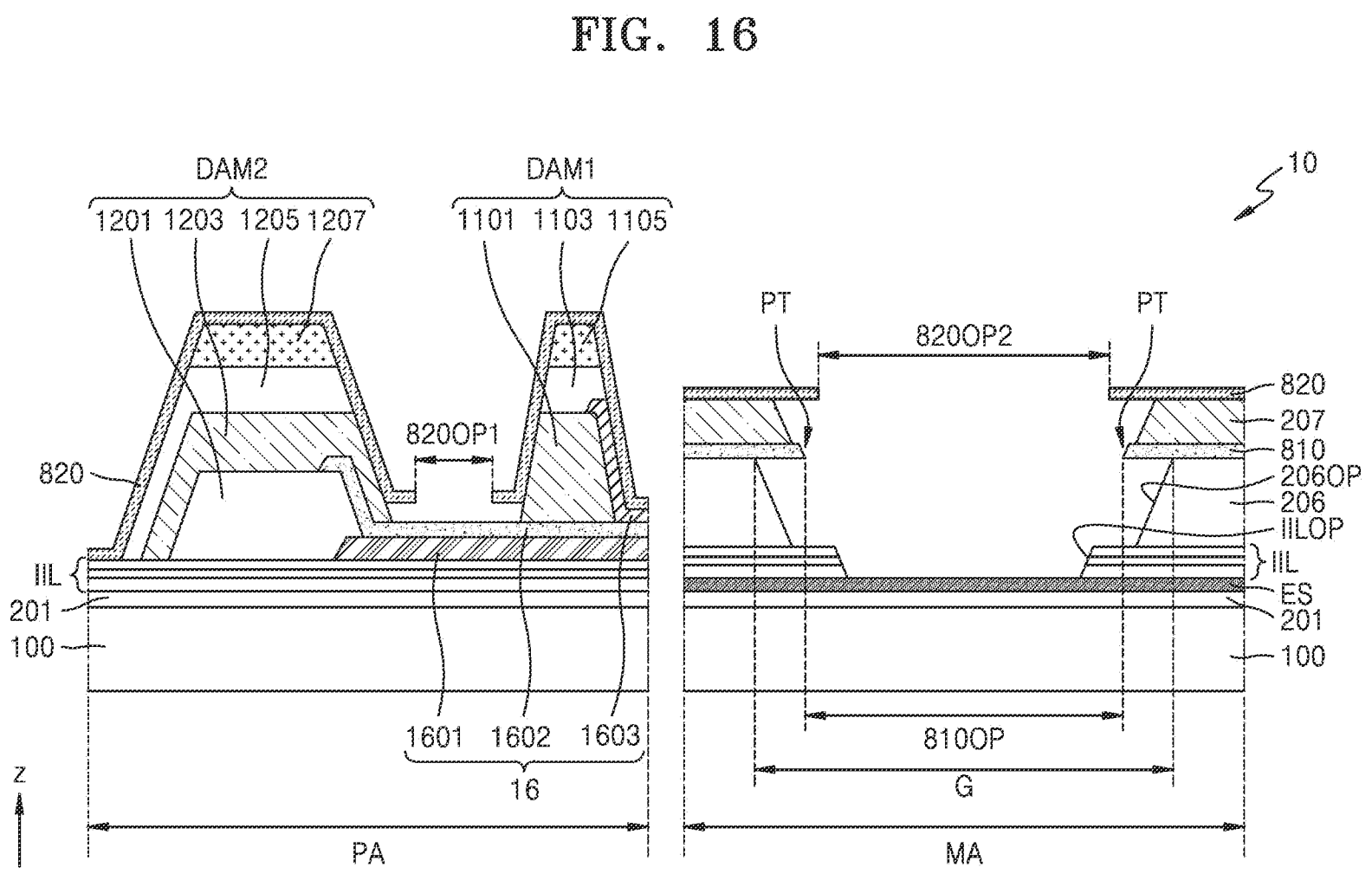

Referring to FIG. 16, in the structure described with reference to FIG. 14, the organic bridge BR may be etched and removed using the sacrificial layer 820 as a mask.

The organic bridge BR may be etched and removed through the second sub-hole 820OP1 of the sacrificial layer 820. Because the organic bridge BR covering a portion of the boundary of the notch 16N of the common power supply line 16 is removed, there may not be the organic material layer in the region between the first dam DAM1 and the second dam DAM2. In other words, the first dam DAM1 may be apart and separated from the second dam DAM2 completely.

A portion of the second planarization layer 207 and a portion of the first planarization layer 206 may be removed through the third sub-hole 820OP2 of the sacrificial layer 820. The second planarization layer 207 may define a hole overlapping the first hole 810OP of the metal layer 810. The first planarization layer 206 may form a third hole 206OP overlapping the first hole 810OP of the metal layer 810. The organic bridge BR in the peripheral area PA, a portion of the second planarization layer 207, and a portion of the first planarization layer 206 in the intermediate area MA may be removed through the same process.

The third hole 206OP of the first planarization layer 206 may overlap the second hole IILOP of the inorganic insulating layer IIL to form the first groove G. The width of the third hole 206OP of the first planarization layer 206 may be greater than the width of the first hole 810OP of the metal layer 810. That is, the metal layer 810 and the first groove G may form an undercut structure in which a portion of the first planarization layer 206 located on the lower surface of the metal layer 810 is removed. The metal layer 810 may have a tip PT extending in a direction from the upper surface of the first planarization layer 206 to the center of the first groove G. The tip PT may protrude from the lateral surface of the first planarization layer 206 forming the inner surface of the first groove G to the center of the first groove G.

Figure 17:
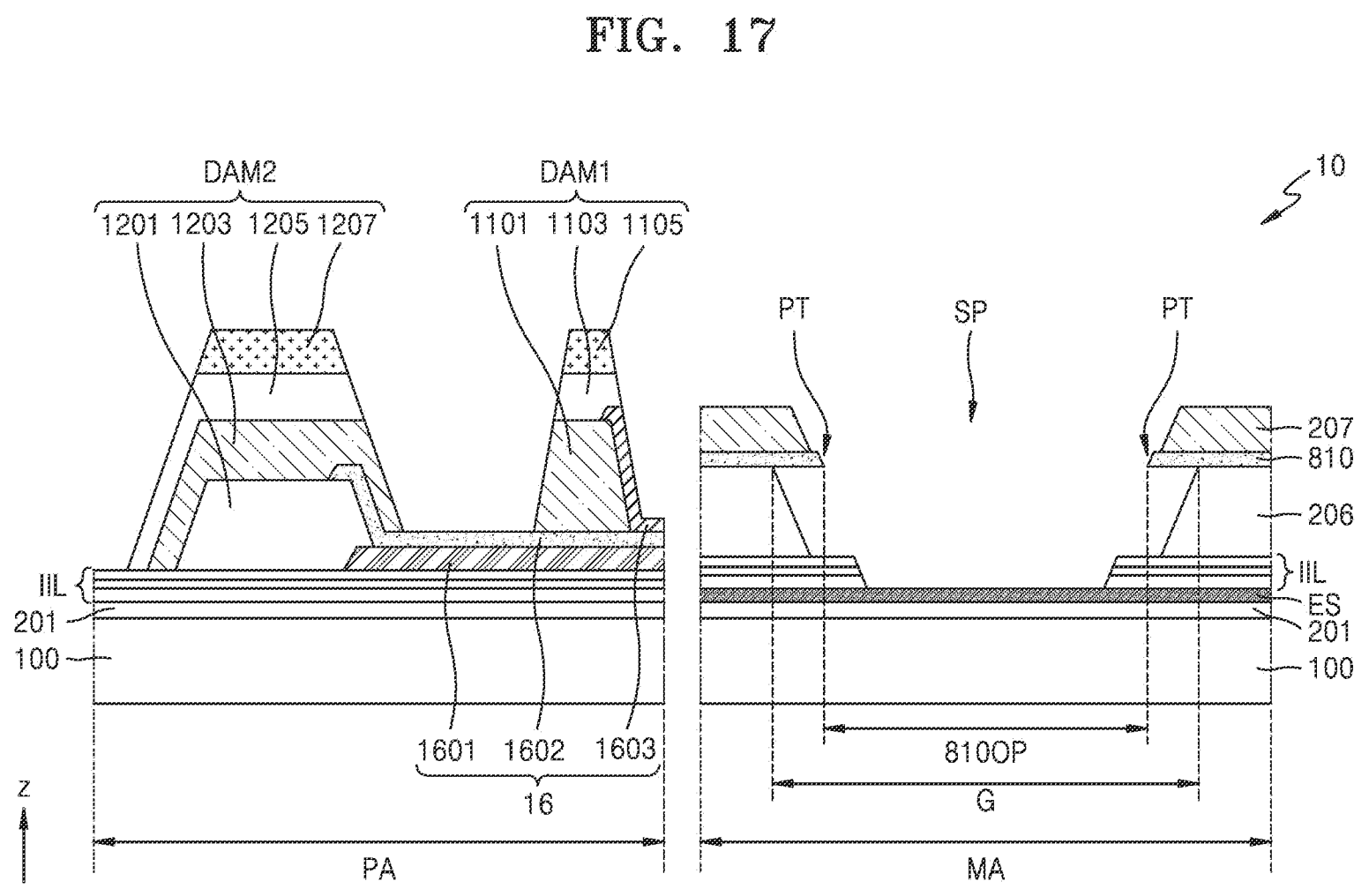

Referring to FIG. 17, the sacrificial layer 820 may be etched and removed from the structure described with reference to FIG. 16.

Because the sacrificial layer 820 in the peripheral area PA is removed, the first dam DAM1, the second dam DAM2, and the common power supply line 16 may be exposed. The organic material layer including the organic material may not be arranged between the first dam DAM1 and the second dam DAM2. The organic material layer connecting the first dam DAM1 and the second dam DAM2 to each other may be completely removed. Accordingly, the boundary of the notch 16N arranged in the region between the first dam DAM1 and the second dam DAM2 may be exposed.

The sacrificial layer 820 in the intermediate area MA and the sacrificial layer 820 in the peripheral area PA may be removed through the same process. Because the sacrificial layer 820 is removed, the separator SP including the first groove G and the tip PT may be formed in the intermediate area MA. As described above, the separator SP may prevent or reduce moisture and the like from the opening area OA (see FIG. 6) from penetrating the display area DA (see FIG. 6) along the organic material layer by separating the organic material layer such as the first functional layer 221 (see FIG. 7), the second functional layer 223 (see FIG. 7), and the like formed afterwards.

Then, the first inorganic encapsulation layer 310 may be formed on the substrate 100 entirely. The first inorganic encapsulation layer 310 may be in direct contact with the boundary of the notch 16N of the common power supply line 16 arranged in the region between the first dam DAM1 and the second dam DAM2. That is, a portion of the boundary of the common power supply line 16 defining the notch 16N may be covered by the first inorganic encapsulation layer 310.

According to some embodiments of the present disclosure, the display panel with a relatively extended display area may be implemented. However, the scope of embodiments according to the present disclosure are not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel comprising:
a substrate including an opening area, a display area surrounding at least a portion of the opening area, an intermediate area between the opening area and the display area, and a peripheral area outside the display area;
a first dam in the peripheral area and surrounding the display area;
a second dam in the peripheral area and outside the first dam;
a power supply line in the peripheral area and defining a notch overlapping the first dam and the second dam; and
a first inorganic encapsulation layer in the display area, the intermediate area, and the peripheral area to cover the first dam and the second dam,
wherein a portion of a boundary of the notch between the first dam and the second dam is in direct contact with the first inorganic encapsulation layer.

2. The display panel of claim 1, further comprising a metal pattern in the peripheral area and overlapping the notch, wherein the metal pattern is spaced apart from the power supply line.

3. The display panel of claim 1, wherein the notch includes a first boundary, a second boundary, and a third boundary, wherein the first boundary extends from the first dam to the second dam, the second boundary faces the first boundary, and the third boundary connects the first boundary and the second boundary to each other, and wherein the third boundary overlaps the first dam.

4. The display panel of claim 1, further comprising:
an organic encapsulation layer on the first inorganic encapsulation layer; and
a second inorganic encapsulation layer on the organic encapsulation layer,
wherein an end of the organic encapsulation layer is on the first dam.

5. The display panel of claim 1, further comprising:
a first organic insulating layer in the intermediate area and defining a first groove surrounding the opening area;
a metal layer on the first organic insulating layer and including a tip extending in a direction from an upper surface of the first organic insulating layer to a center of the first groove; and
a second organic insulating layer on the metal layer.

6. The display panel of claim 5, further comprising
a light-emitting diode in the display area and including a pixel electrode, an opposite electrode, and an intermediate layer between the pixel electrode and the opposite electrode,
wherein the intermediate layer includes a first portion and a second portion spaced apart and separated from each other by the tip.

7. An electronic apparatus comprising:
a display panel including a substrate including an opening area, a display area surrounding at least a portion of the opening area, an intermediate area between the display area and the opening area, and a peripheral area outside the display area; and
a component overlapping the opening area of the display panel,
wherein the display panel further includes:
a first dam in the peripheral area and surrounding the display area;
a second dam in the peripheral area and outside the first dam;
a power supply line in the peripheral area and defining a notch overlapping the first dam and the second dam; and
a first inorganic encapsulation layer in the display area, the intermediate area, and the peripheral area to cover the first dam and the second dam,
wherein a portion of a boundary of the notch between the first dam and the second dam is in direct contact with the first inorganic encapsulation layer.

8. The electronic apparatus of claim 7, further comprising a metal pattern in the peripheral area and overlapping the notch, wherein the metal pattern is spaced apart from the power supply line.

9. The electronic apparatus of claim 7, wherein the notch includes a first boundary, a second boundary, and a third boundary, wherein the first boundary extends from the first dam to the second dam, the second boundary faces the first boundary, and the third boundary connects the first boundary and the second boundary to each other, and wherein the third boundary overlaps the first dam.

10. The electronic apparatus of claim 7, further comprising:
an organic encapsulation layer on the first inorganic encapsulation layer; and
a second inorganic encapsulation layer on the organic encapsulation layer,
wherein an end of the organic encapsulation layer is on the first dam.

11. The electronic apparatus of claim 7, further comprising:
a first organic insulating layer in the intermediate area and defining a first groove surrounding the opening area;
a metal layer on the first organic insulating layer and including a tip extending in a direction from an upper surface of the first organic insulating layer to a center of the first groove; and
a second organic insulating layer on the metal layer.

12. The electronic apparatus of claim 11, further comprising a light-emitting diode in the display area and including a pixel electrode, an opposite electrode, and an intermediate layer between the pixel electrode and the opposite electrode, wherein the intermediate layer includes a first portion and a second portion spaced apart and separated from each other by the tip.

13. A method of manufacturing a display panel, the method comprising:

preparing a substrate including an opening area, a display area surrounding at least a portion of the opening area, an intermediate area between the opening area and display area, and a peripheral area outside the display area;

forming a first dam, a second dam, a power supply line, and an organic bridge in the peripheral area, wherein the first dam surrounds the display area, the second dam is outside the first dam, the power supply line defines a notch overlapping the first dam and the second dam, and the organic bridge covers a portion of a boundary of the notch located between the first dam and the second dam;

forming a sacrificial layer to cover the first dam, the second dam, and the organic bridge;

removing a portion of the sacrificial layer overlapping the organic bridge;

removing the organic bridge; and removing the sacrificial layer.

14. The method of claim 13, wherein the organic bridge connects the first dam and the second dam to each other.

15. The method of claim 13, further comprising forming a first inorganic encapsulation layer in the display area, the intermediate area, and the peripheral area to cover the first dam and the second dam, wherein the portion of the boundary of the notch located between the first dam and the second dam is in direct contact with the first inorganic encapsulation layer.

16. The method of claim 13, further comprising, before the forming of the sacrificial layer:

forming a first organic insulating layer in the intermediate area;

forming a metal layer on the first organic insulating layer, wherein the metal layer defines a first hole surrounding the opening area; and forming a second organic insulating layer on the metal layer, wherein the second organic insulating layer defines a first sub-hole overlapping the first hole.

17. The method of claim 16, wherein, in the forming of the sacrificial layer, the sacrificial layer is formed on the second organic insulating layer and the first organic insulating layer exposed through the first sub-hole.

18. The method of claim 16, wherein, in the removing of the portion of the sacrificial layer overlapping the organic bridge, a portion of the sacrificial layer overlapping the first hole is simultaneously removed.

19. The method of claim 16, wherein, in the removing of the organic bridge, a portion of the first organic insulating layer overlapping the first hole is simultaneously removed, and a first groove surrounding the opening area is formed.

20. The method of claim 19, wherein the metal layer forms a tip extending in a direction from an upper surface of the first organic insulating layer to a center of the first groove.

* * * * *